(12) United States Patent
Elsherbini et al.

(10) Patent No.: US 11,282,812 B2
(45) Date of Patent: Mar. 22, 2022

(54) THERMAL MANAGEMENT SOLUTIONS FOR STACKED INTEGRATED CIRCUIT DEVICES USING JUMPING DROPS VAPOR CHAMBERS

(71) Applicant: Intel Corporation, Santa Clara, CA (US)

(72) Inventors: Adel Elsherbini, Chandler, AZ (US); Feras Eid, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 751 days.

(21) Appl. No.: 16/014,319

(22) Filed: Jun. 21, 2018

(65) Prior Publication Data

US 2019/0393193 A1    Dec. 26, 2019

(51) Int. Cl.
| | |
|---|---|
| H01L 25/065 | (2006.01) |
| H01L 23/373 | (2006.01) |
| H01L 23/498 | (2006.01) |
| H01L 23/10 | (2006.01) |
| H01L 23/367 | (2006.01) |
| H01L 23/427 | (2006.01) |

(52) U.S. Cl.
CPC .......... *H01L 25/0657* (2013.01); *H01L 23/10* (2013.01); *H01L 23/3677* (2013.01); *H01L 23/373* (2013.01); *H01L 23/427* (2013.01); *H01L 23/49811* (2013.01)

(58) Field of Classification Search
CPC . H01L 25/0657; H01L 23/10; H01L 23/3677; H01L 23/373; H01L 23/427; H01L 23/49811
See application file for complete search history.

(56) References Cited

U.S. PATENT DOCUMENTS

| | | |
|---|---|---|
| 2009/0057881 A1 | 3/2009 | Arana et al. |
| 2010/0328889 A1 | 12/2010 | Campbell et al. |
| 2013/0032934 A1 | 2/2013 | Fisch |
| 2013/0258578 A1 | 10/2013 | Yim et al. |

(Continued)

OTHER PUBLICATIONS

International Search Report and Written Opinion for PCT Application No. PCT/US19/33039, dated Sep. 11, 2019.

(Continued)

*Primary Examiner* — Matthew L Reames
(74) *Attorney, Agent, or Firm* — Essential Patents Group, LLP.

(57) ABSTRACT

An integrated circuit structure may be formed having a first integrated circuit device, a second integrated circuit device electrically coupled to the first integrated circuit device with a plurality of device-to-device interconnects, and at least one jumping drops vapor chamber between the first integrated circuit device and the second integrated circuit device wherein at least one device-to-device interconnect of the plurality of device-to-device interconnects extends through the jumping drops vapor chamber. In one embodiment, the integrated circuit structure may include three or more integrated circuit devices with at least two jumping drops vapor chambers disposed between the three or more integrated circuit devices. In a further embodiment, the two jumping drops chambers may be in fluid communication with one another.

17 Claims, 16 Drawing Sheets

(56) References Cited

U.S. PATENT DOCUMENTS

| | | |
|---|---|---|
| 2013/0277821 A1 | 10/2013 | Lundberg |
| 2014/0264915 A1 | 9/2014 | Huang et al. |
| 2015/0255429 A1* | 9/2015 | Katkar ............... H01L 25/0657 257/712 |
| 2017/0092561 A1 | 3/2017 | Eid et al. |
| 2017/0092619 A1 | 3/2017 | Refai-Ahmed et al. |
| 2017/0103954 A1 | 4/2017 | Wu et al. |

OTHER PUBLICATIONS

International Preliminary Report on Patentability for PCT Application No. PCT/US2019/033039, dated Dec. 30, 2020.
Office Action for U.S. Appl. No. 16/014,312, dated Jul. 15, 2021.
Office Action for U.S. Appl. No. 16/014,313, dated Jul. 16, 2021.
Final Office Action for U.S. Appl. No. 16/014,312, dated Nov. 29, 2021.
Final Office Action for U.S. Appl. No. 16/014,313, dated Nov. 29, 2021.

* cited by examiner

THERMAL MANAGEMENT SOLUTIONS FOR STACKED INTEGRATED CIRCUIT DEVICES USING JUMPING DROPS VAPOR CHAMBERS

TECHNICAL FIELD

Embodiments of the present description generally relate to the removal of heat from integrated circuit devices, and, more particularly, to thermal management solutions wherein at least one jumping drops vapor chamber is utilized between stacked integrated circuit devices.

BACKGROUND

Higher performance, lower cost, increased miniaturization, and greater packaging density of integrated circuits within integrated circuit devices are ongoing goals of the electronics industry. As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated in a stacked configuration. As will be understood to those skilled in the art, when multiple integrated circuit devices are stacked, some of the integrated circuit devices will be "internally" positioned between an adjacent integrated circuit device and a substrate to which the stacked integrated circuit devices are attached or will be positioned between a pair of adjacent integrated circuit devices. As such, these internally positioned integrated circuit devices are partially isolated from thermal management solutions, such as heat spreaders, since the integrated circuit devices and/or the substrate to which the integrated circuit devices may be adjacent, are generally not efficient thermal conductors. Thus, the internally positioned integrated circuit devices may exceed their temperature limits and be damaged or destroyed, leading to the failure of the entire integrated circuit package. Alternatively, if the integrated circuits have thermal throttling control, they may reduce their operating frequency and, thus, their power to operate at lower temperature and avoid failures. However, this results in lower overall performance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
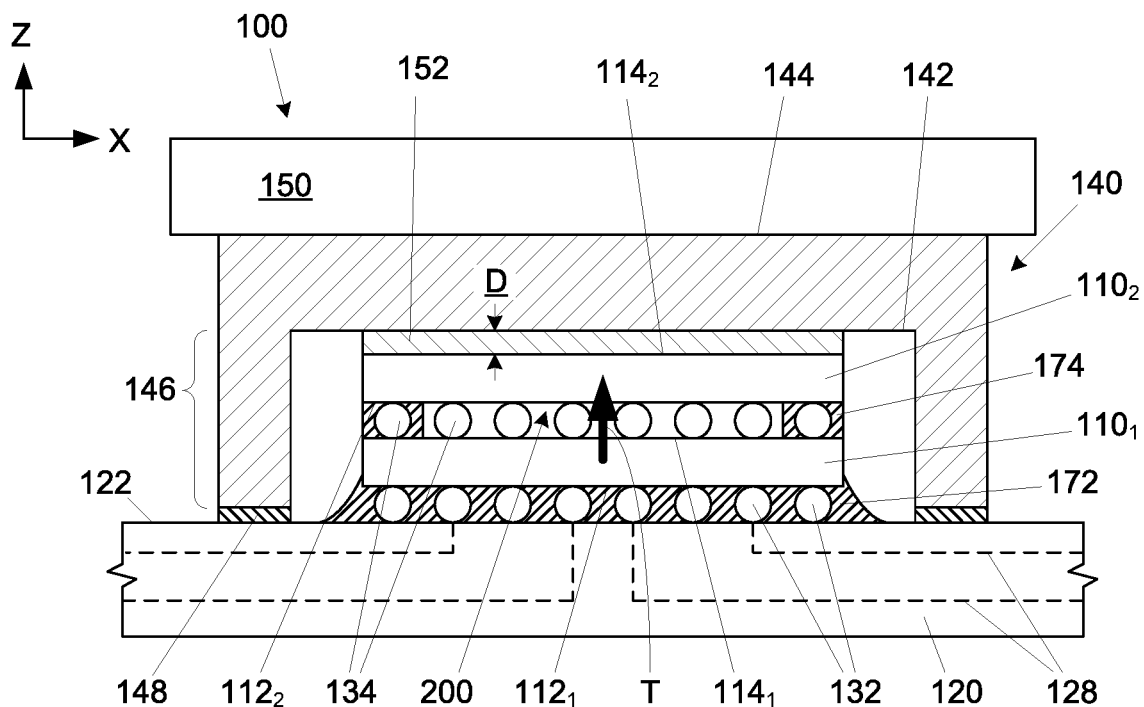
FIG. 1 is a side cross-sectional view of an integrated circuit structure having stacked integrated circuit devices with a jumping drops vapor chamber between two of the integrated circuit devices, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures. as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description may include an integrated circuit structure comprising a first integrated circuit device, a second integrated circuit device electrically coupled to the first integrated circuit device with a plurality of device-to-device interconnects, and at least one jumping drops vapor chamber between the first integrated circuit device and the second integrated circuit device wherein at least one device-to-device interconnects of the plurality of device-to-device interconnects extends through the jumping drops vapor chamber. In one embodiment, the integrated circuit structure may include three or more integrated circuit devices with at least two jumping drops vapor chambers disposed between the three or more integrated circuit devices. In a further embodiment, the two jumping drops chambers may be in fluid communication with one another.

FIG. 1 illustrates an integrated circuit package having stacked integrated circuit devices coupled with a heat dissipation structure. In the production of integrated circuit packages, integrated circuit devices are generally mounted on substrates, which provide electrical communication routes between the integrated circuit devices and/or with external components. As shown in FIG. 1, an integrated circuit package 100 may comprise a plurality of integrated circuit devices (illustrated as a first integrated circuit device $110_1$, and a second integrated circuit device $110_2$), such as microprocessors, chipsets, graphics devices, wireless devices, memory devices, application specific integrated circuits, combinations thereof, stacks thereof, or the like, attached to a substrate 120, such as an interposer, a printed circuit board, a motherboard, and the like. In one embodiment, the first integrated circuit device $110_1$ may be attached to a first surface 122 (also known as the "die side") of the substrate 120 through a plurality of interconnects 132, such as reflowable solder bumps or balls, in a configuration generally known as a flip-chip or controlled collapse chip connection ("C4") configuration. The device-to-substrate interconnects 132 may extend from bond pads (not shown) on a first surface $112_1$ of the first integrated circuit device $110_1$ and bond pads (not shown) on the first surface 122 of the substrate 120. The integrated circuit device bond pads (not shown) of the first integrated circuit device $110_1$ may be in electrical communication with circuitry (not shown) within the first integrated circuit device $110_1$. The substrate 120 may include at least one conductive route 128 extending therethrough or thereon to form electrical connections from the first integrated circuit device $110_1$ to external components (not shown).

The second integrated circuit device $110_2$ may be attached to a second surface $114_1$ of the first integrated circuit device $110_1$ through a plurality of device-to-device interconnects 134, such as reflowable solder bumps or balls, in a configuration generally known as a flip-chip or controlled collapse chip connection ("C4") configuration. The device-to-device interconnects 134 may extend from bond pads (not shown) on a first surface $112_2$ of the second integrated circuit device $110_2$ and bond pads (not shown) on the second surface $114_1$ of the first integrated circuit device $110_1$. The bond pads (not shown) on the second surface $114_1$ of the first integrated circuit device $110_1$ may be in electrical communication with integrated circuitry (not shown) and/or through-silicon vias (not shown) within the first integrated circuit device $110_1$. The bond pads (not shown) on the first surface $112_2$ of the second integrated circuit device $110_2$ may be in electrical communication with integrated circuitry (not shown) within the second integrated circuit device $110_2$. The device-to-device interconnects 134 are not limited to solder bumps or balls, as illustrated, but may also be formed through direct copper-to-copper contacts or through conductive adhesive, as will be understood to those skilled in the art.

The substrate 120 may be primarily composed of an appropriate dielectric material, including, but not limited to, bismaleimide triazine resin, fire retardant grade 4 material, polyimide materials, glass reinforced epoxy matrix material, and the like, as well as laminates or multiple layers thereof. The substrate conductive routes 128, also known as metallization, may be composed of any conductive material, including but not limited to metals, such as copper and aluminum, and alloys thereof. As will be understood to those skilled in the art, the substrate conductive routes 128 may be formed as a plurality of conductive traces (not shown) formed on layers of dielectric material (constituting the dielectric material of the substrate 120), which are connected by conductive vias (not shown). Furthermore, the substrate 120 may be either a cored or a coreless substrate.

The device-to-substrate interconnects 132 and the device-to-device interconnects 134 can be made of any appropriate material, including, but not limited to, solders materials. The solder materials may be any appropriate material, including, but not limited to, tin, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. When the first integrated circuit device $110_1$ is attached to the substrate 120 with device-to-substrate interconnects 132 made of solder and/or when the second integrated circuit device $110_2$ is attached to the first integrated circuit device $110_1$ with the device-to-device interconnects 134 made of solder, the solder is reflowed, either by heat, pressure, and/or sonic energy to secure the solder therebetween.

As further illustrated in FIG. 1 and according to one embodiment of the present description, a heat dissipation device 140, such as a heat spreader, may be thermally coupled with a second surface $114_2$ (opposing the first surface $112_2$) of the second integrated circuit device $110_2$. In one embodiment, the heat dissipation device 140 may have a first surface 142 and an opposing second surface 144, wherein the first surface 142 of the heat dissipation device 140 is thermally coupled to the second surface $114_2$ of the second integrated circuit device $110_2$ with a thermal interface material 152, such as a grease or polymer, to facilitate heat transfer therebetween. The heat dissipation device 140 may be made of any appropriate thermally conductive material, including, but not limited to at least one metal material and alloys of more than one metal. In one embodiment, the heat dissipation device 140 may comprise copper, nickel, aluminum, alloys thereof, laminated metals including coated materials (such as nickel coated copper), and the like.

As further shown in FIG. 1, the second surface 144 of the heat dissipation device 140 may be in thermal contact with an active heat removal device 150 (shown as a generic block), including but not limited to a heat pipe, a high surface area dissipation structure with a fan (such as a structure having fins or pillars/columns formed in a thermally conductive structure), a liquid cooling device, and the like, which removes heat from the heat dissipation device 140, as will be understood to those skilled in the art.

In one embodiment of the present description, the heat dissipation device 140 may include at least one footing 146 extending between the first surface 142 of the heat dissipation device 140 and the first surface 122 of the substrate 120, wherein the heat dissipation device footing 146 may be attached to the first surface 122 of the substrate 120 with an attachment adhesive or sealant layer 148. As illustrated in FIG. 1, the heat dissipation device 140 may be a single material throughout, such as when the heat dissipation device 140 including the heat dissipation device footing 146 is formed by a single process step, including but not limited to stamping, skiving, molding, and the like. In various embodiments, the heat dissipation device footing 146 may be a plurality of walls, pillars, or the like, or may be a single "picture frame" structure surrounding the first integrated circuit device $110_1$ and the second integrated circuit device $110_2$. The attachment adhesive or sealant layer 148 may be any appropriate material, including, but not limited to, silicones (such as polydimethylsiloxane), epoxies, and the like. It is understood that the heat dissipation device footing 146 not only secures the heat dissipation device 140 to the substrate 120, but also maintains a desired distance D between the first surface 142 of the heat dissipation device 140 and the second surface $114_2$ of the second integrated circuit devices $110_2$. This distance D may be referred to as the "bond line thickness".

It is further understood that a first underfill material 172, such as an epoxy material, may be disposed between the first surface $112_1$ of the integrated circuit device $110_1$ and the first surface 122 of the substrate 120, and may surround the plurality of device-to-substrate interconnects 132. The first underfill material 172 may provide structural integrity and may prevent contamination, as will be understood to those skilled in the art.

As shown in FIG. 1, at least one jumping drops vapor chamber 200 may be formed between the second surface $114_1$ of the first integrated circuit device $110_1$ and the first surface $112_2$ of the second integrated circuit device $110_2$. In one embodiment, at least one of the device-to-device interconnects 134 extends through the jumping drops vapor chamber 200. In another embodiment, a second underfill material 174, such as an epoxy material, may be disposed between the second surface $114_1$ of the first integrated circuit device $110_1$ and the first surface $112_2$ of the second integrated circuit device $110_2$ to defined the jumping drops vapor chamber 200, as will be discussed. In a further embodiment, the second underfill material 174 may surround at least of the one device-to-device interconnects 134.

In one embodiment of the present description, the first integrated circuit device $110_1$ may have a lower temperature limit (temperature at which damage to circuitry therein may occur) than the second integrated circuit device $110_2$. Thus, the second integrated circuit device $110_2$ may be placed next to the heat dissipation device 140, while the first integrated circuit device $110_1$ is placed next to the substrate 102, which may dissipate some of the heat generated by the first integrated circuit device $110_1$. As will be understood to those skilled in the art, it is desired to maximize heat transfer away from the integrated circuit package 100, while minimizing heat transfer from the second integrated circuit device $110_2$ to the first integrated circuit device $110_1$ in order to prevent the first integrated circuit device $110_1$ from exceeding its temperature limit. Therefore, the jumping drops vapor chamber 200 may be fabricated such that it transfers heat in direction T from the first integrated circuit device $110_1$ to the second integrated circuit device $110_2$ (e.g. the +z direction), rather than in the opposite direction from the second integrated circuit device $110_2$ to the first integrated circuit device $110_1$ (e.g. the −z direction), as will be discussed. Furthermore, due to design and manufacturing requirements, the integrated circuit device $110_1$ is generally relatively thin to allow high density through silicon vias through it. However, the smaller thickness results in poorer lateral (e.g. horizontal or x-y direction) heat spreading performance for the integrated devices. The jumping drops vapor chamber may also help improve lateral heat spreading across the integrated circuit device $110_1$.

Figure 2:
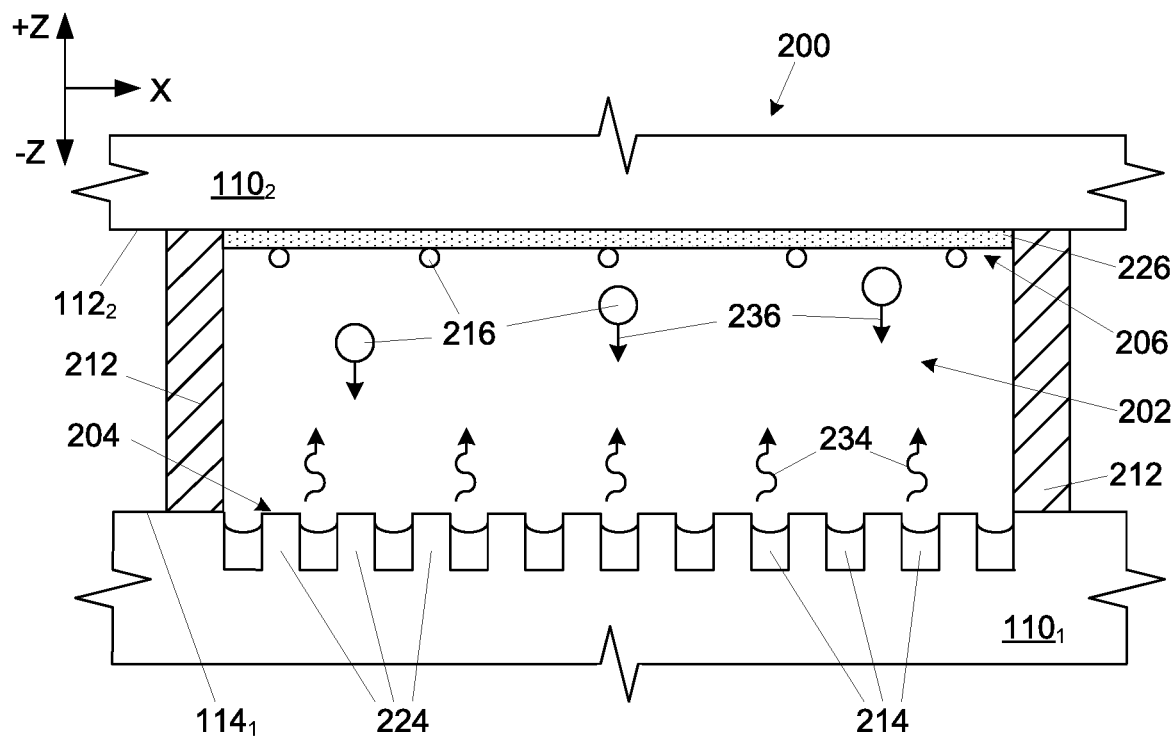
FIG. 2 is a side cross-sectional view of a jumping drops vapor chamber between two integrated circuit devices, according to one embodiment of the present description.

In one embodiment shown in FIG. 2, the jumping drops vapor chamber 200 may comprise a vapor space 202, which may be sealed, defined by a hydrophilic evaporation surface 204 formed on or in the second surface $114_1$ of the first integrated circuit device $110_1$, an opposing hydrophobic condensation surface 206 formed on the first surface $112_2$ of the second integrated circuit device $110_2$, and at least one sidewall 212 extending between the hydrophilic evaporation surface 204 and the hydrophobic condensation surface 206, wherein a working fluid 214 is disposed within the vapor space 202. The at least one sidewall 212 may be formed from the second underfill material 174 of FIG. 1. The working fluid 214 may be any appropriate material, including, but not limited to, deionized water and dielectric liquids. It is understood that the amount of working fluid 214 within the vapor space 202 is dependent on the liquid used, the size of the vapor space 202, operating temperatures of the integrated circuit devices, and various other operating and manufacturing parameters.

As illustrated in FIG. 2, in one embodiment of the present description, the hydrophilic evaporation surface 204 may include projections or wicks 224 to render the second surface $114_1$ of the first integrated circuit device $110_1$ hydrophilic. The projections or wicks 224 may be formed by machining the second surface $114_1$ of the first integrated circuit device $110_1$, including but not limited to reactive ion etch, skiving, dicing, and laser ablation. In an embodiment of the present description, the hydrophobic condensation surface 206 may be formed by coating the first surface $112_2$ of the second integrated circuit device $110_2$ with a hydrophobic layer 226, such as a self-assembled monolayer material, including but not limited to thiols or silanes. As such self-assembled monolayers are only a few nanometers thick, they may have a negligible impact on thermal conductivity. In a specific embodiment, the hydrophobic layer 226 may be formed by depositing patterned silver nanoparticles on the first surface $112_2$ of the second integrated circuit device $110_2$ by electroless galvanic deposition followed by a monolayer coating of 1-hexadecanethiol.

In operation, as shown in FIG. 2, the working fluid 214 evaporates at the hydrophilic evaporation surface 204 when the first integrated circuit device $110_1$ heats up. The evaporated working fluid 214 flows to the hydrophobic condensation surface 206 (shown by waving lines 234). At the hydrophobic condensation surface 206, when it is cooler than the hydrophilic evaporation surface 204, the working fluid 214 condenses, which transports the heat away from the first integrated circuit device $110_1$. When drops 216 of the working fluid 214 reach a specific size and coalesce, the excess surface energy released from the coalescence propels the working fluid drops 216 to spontaneously jump (shown by lines 236) back to the hydrophilic evaporation surface 204, independent of gravity, providing a return path for an evaporation/condensation cycle, as will be understood by those skilled in the art. The jumping drops chamber only acts as a conductor in the +z direction (when the temperature of the first integrated circuit device $110_1$ is greater than that of the second integrated circuit device $110_2$), while it acts as an insulator in the −z direction (when the temperature of the second integrated circuit device $110_2$ is greater than that of the first integrated circuit device $110_1$).

The jumping drops vapor chamber 200 differs from traditional vapor chambers in that traditional vapor chambers rely on capillary action for liquid return, requiring relatively long wicks to allow for the large working fluid flow rates that are necessary for cooling. However, relatively long wicks have a high thermal resistance, which reduces the overall thermal conductivity of the traditional vapor chamber. In jumping drops vapor chambers 200, the capillary limit of traditional vapor chambers is surpassed because the return is achieved by the jumping action previously described. The projections or wicks 224 of the hydrophilic evaporation surface 204 are now only used for capturing the returning working fluid drops 216, and, thus, can be made much shorter and finer than wicks in a traditional vapor chamber. This may lead to much higher thermal conductivities of the jumping drops vapor chamber 200 in the +z direction compared to traditional vapor chambers. Moreover, the finer projections or wicks 224 may allow higher heat flux before boiling incipiency and may expand the range of allowable heat fluxes before dry-out occurs, as will be understood to those skilled in the art. Furthermore, as will also be understood to those skilled in the art, the first integrated circuit device $110_1$ may have specific areas that are hotter than other areas during operation, known as hot spot areas. The jumping drops vapor chamber 200 may act to dynamically mitigate such hot spots areas due to the fact that the evaporation rate of the working fluid 214 will be higher in hot spot areas than other areas, leading to fast temperature uniformity without requiring any special designs for the hot spot areas.

Figure 3:
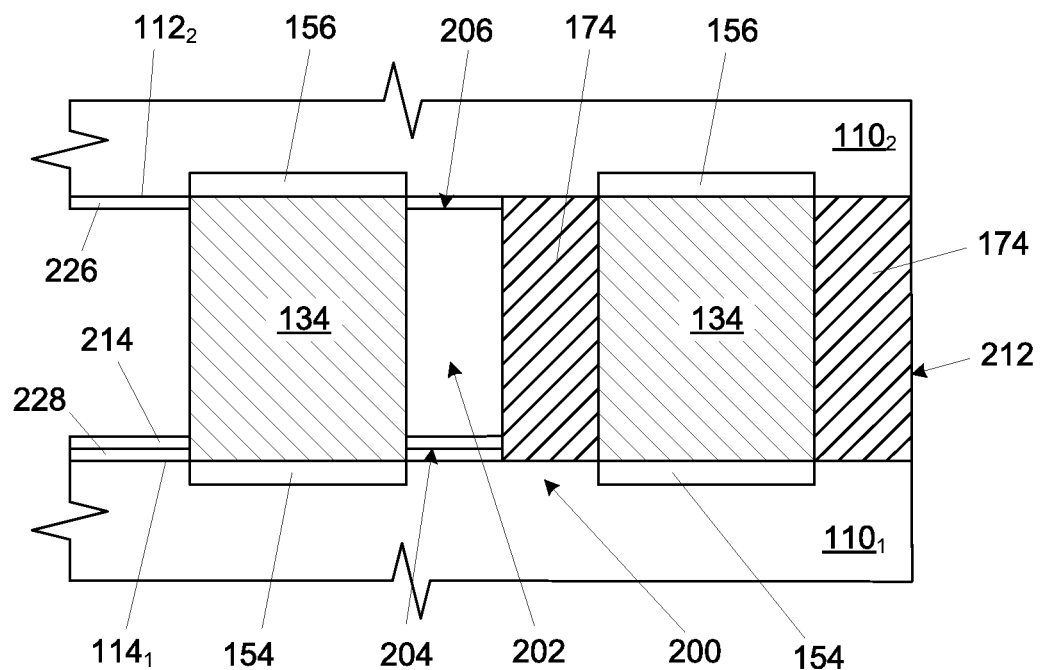
FIG. 3 is a side cross-sectional view of a jumping drops vapor chamber between two integrated circuit devices with device-to-device interconnects extending through the vapor space and the sidewall thereof, according to a further embodiment of the present description.
Figure 4:
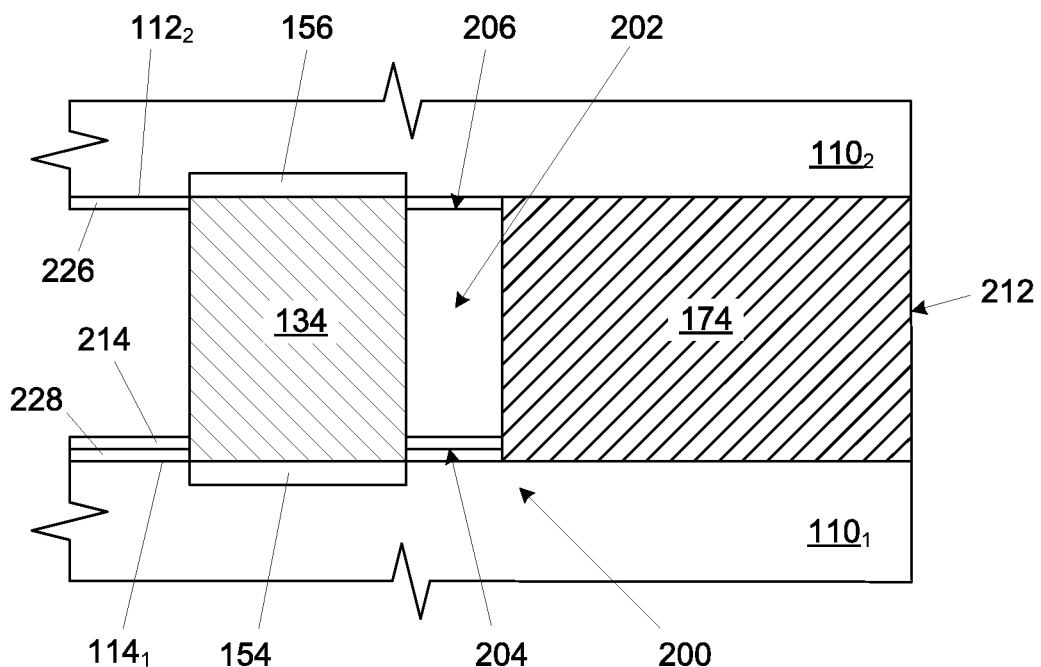
FIG. 4 is a side cross-sectional view of a jumping drops vapor chamber between two integrated circuit devices with device-to-device interconnects extending through the vapor space, but not extending through the sidewall thereof, according to an embodiment of the present description.

In a further embodiment of the present description shown in FIG. 3, the hydrophilic evaporation surface 204 may be formed by coating the second surface $114_1$ of the first integrated circuit device $110_1$ with a hydrophilic material layer 228, such as a silanes and silicone compounds. As shown in FIG. 3, at least one of the device-to-device interconnects 134 may extend through the vapor space 202 of the jumping drops vapor chamber 200 from bond pads 154 at the second surface $114_1$ of the first integrated circuit device $110_1$ to bond pads 156 at the first surface $112_2$ on the second integrated circuit device $110_2$. Therefore, the working fluid 214 must be compatible with the material used to form the device-to-device interconnects 134. As previously discussed, the second underfill material 174 may surround at least one of the device-to-device interconnects 134 to form the sidewall 212 of the jumping drops vapor chamber 200. However, the device-to-device interconnects 134 extending through the second underfill material 174 is optional. As shown in FIG. 4, the sidewall 212 may not include any of the device-to-device interconnects 134 extending therethrough. Furthermore, in one embodiment, the sidewall 212 may be formed of a conductive material, such as being made from the same material as the device-to-device interconnects 134, such as a solder material as previously discussed. Thus, the sidewall 212 may be used to form an electrical connection between the first integrated circuit device $110_1$ and the second integrated circuit device $110_2$, such as an electrical connection of a power signal or a ground signal.

Figure 5:
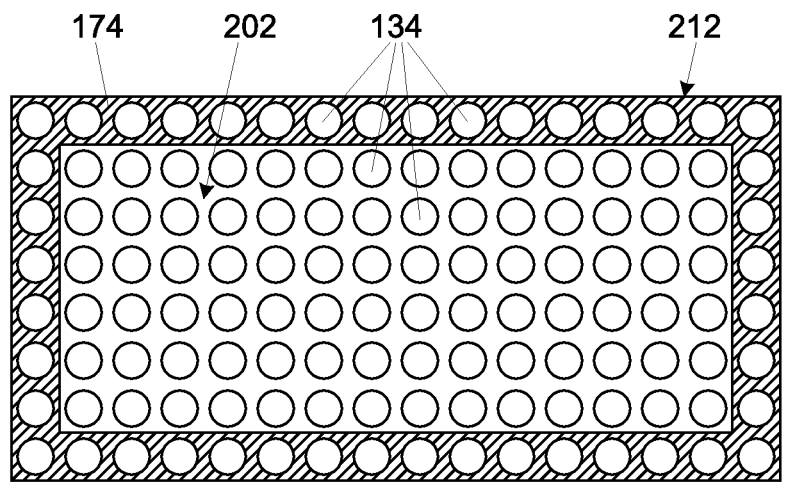
FIGS. 5-8 are plan cross-sectional views of different configurations of jumping drops vapor chambers, according to various embodiments of the present description.
Figure 6:
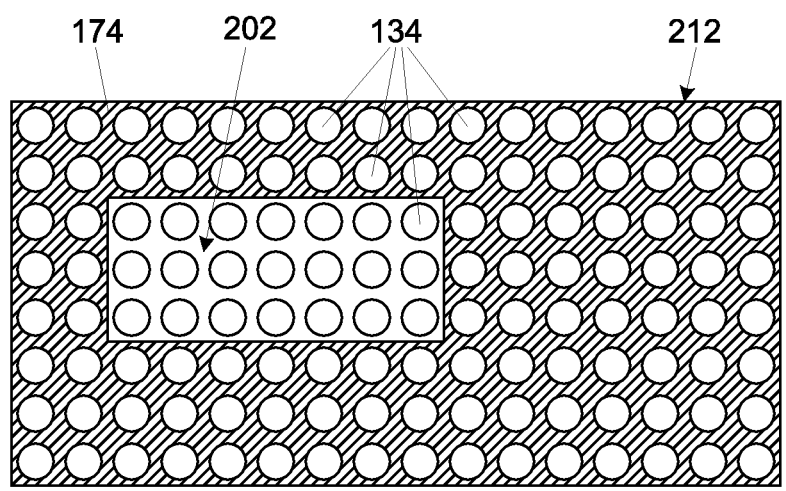

As will be understood, there is a trade-off between an area of the vapor space 202 and an area of the sidewall 212 defining the vapor space 202 of the jumping drops vapor chamber 200, wherein the trade-off is between the mechanical reliability (increases with an increased area of the sidewall 212 and a decreased area of vapor space 202) and an increased area of heat exchange (increases with an increased area of the vapor space 202 and a decreased area of the sidewall 212). An embodiment of a high area of heat exchange, i.e. a large vapor space 202, is shown in FIG. 5. An embodiment of high reliability, i.e. high area for the sidewall 212, is shown in FIG. 6. In the embodiment illustrated in FIG. 6, the vapor space 202 may be specifically positioned for improved heat removal over certain area(s) of the bottom integrated circuit device, e.g. areas of high power density.

Figure 7:
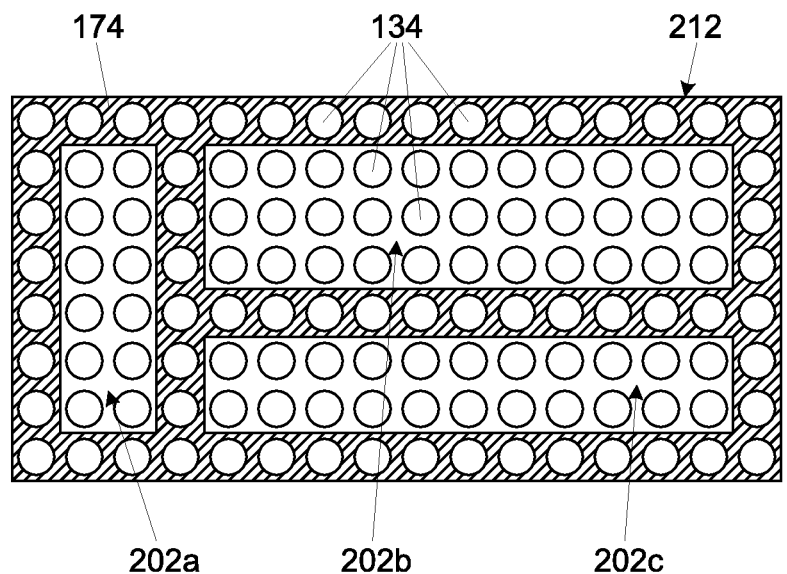

Although the embodiments of the FIGS. 5 and 6 show a single vapor chamber 202, the embodiments of the present application are not so limited. As shown in FIG. 7, multiple vapor chambers may be fabricated (shown as elements 202a, 202b, and 202c). The vapor chambers 202a, 202b, and 202c may be optimized by altering their size (area or volume), by choosing the type of the working fluid 214 (see FIG. 3) disposed therein, and/or by optimizing the pressure within each of the vapor chambers 202a, 202b, and 202c.

Figure 8:
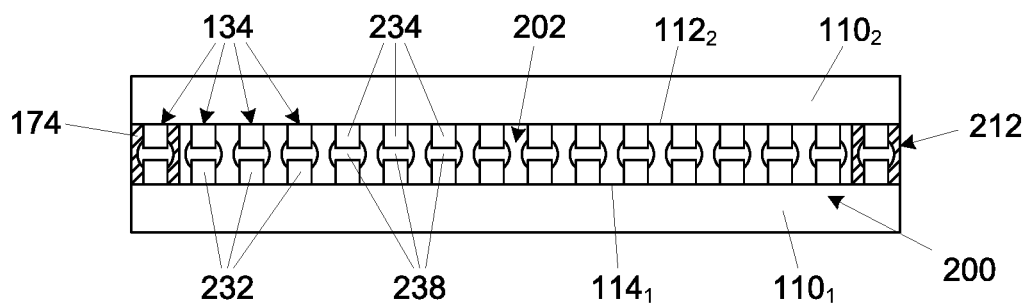

Additionally, in further embodiments, the volume of the jumping drops vapor chamber 200 may be increased by increasing a height H of the vapor space 202, as shown in FIG. 8. This may be achieved by increasing the height or size of the device-to-device interconnects 134, such as by forming a first conductive pillar 232 on the second surface $114_1$ of the first integrated circuit device $110_1$, forming a second conductive pillar 234 on the first surface $112_2$ of the second integrated circuit $110_2$, and attaching the first conductive pillar 232 and the second conductive pillar 234 with a solder material 238, as shown in FIG. 8. As will be understood, increasing the volume of the vapor space 202 can help reduce the steady state pressure and allow the working fluid 214 (see FIG. 3) to evaporate at lower temperatures (for the same dispense volume of the working fluid 214), thus improving the cooling performance of the jumping drops vapor chamber 200. As will be understood to those skilled in the art, the transient response of the jumping drops vapor chamber 200 (i.e. how fast it takes to respond to a sudden appearance of a hot spot and reaches the steady state) is dependent on the volume of the vapor space 202, and, thus, the larger volume results in slower response and vice versa.

Figure 9:
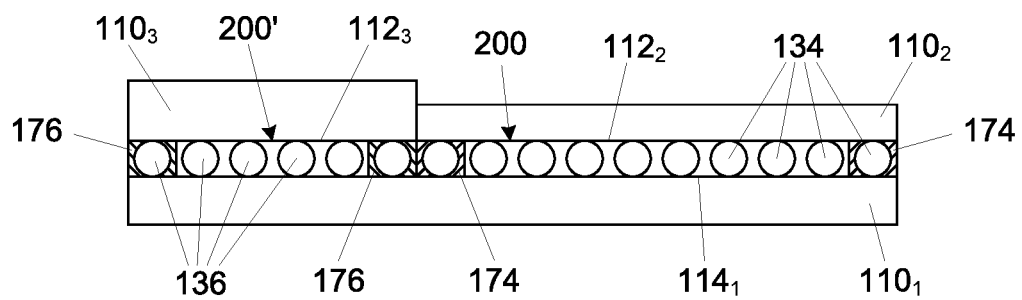
FIGS. 9 and 10 are side cross-section and plan views, respectively, of two integrated circuit devices each attached to a single integrated circuit device with jumping drops vapor chambers formed therebetween, according to one embodiment of the present description.

Although the embodiments of the FIGS. 5 and 6 show one integrated circuit device (e.g. first integrated circuit device $110_1$) attached to another integrated circuit device (e.g. second integrated circuit device $110_2$), embodiments of the present application are not so limited. As shown in FIG. 9, the second integrated circuit device $110_2$ may not take up the entire second surface $114_1$ of the first integrated circuit device $110_1$, and, thus, a third integrated circuit device $110_3$ may also be attached to the second surface $114_1$ of the first integrated circuit device $110_1$ through a plurality of device-to-device interconnects 136, such as reflowable solder bumps or balls, in a configuration generally known as a flip-chip or controlled collapse chip connection ("C4") configuration. The device-to-device interconnects 136 may extend from bond pads (not shown) on a first surface $112_3$ of the third integrated circuit device $110_3$ and bond pads (not shown) on the second surface $114_1$ of the first integrated circuit device $110_1$. As previously discussed, the bond pads (not shown) on the second surface $114_1$ of the first integrated circuit device $110_1$ may be in electrical communication with integrated circuitry (not shown) and/or through-silicon vias (not shown) within the first integrated circuit device $110_1$. The bond pads (not shown) on the first surface $112_3$ of the third integrated circuit device $110_3$ may be in electrical communication with integrated circuitry (not shown) within the third integrated circuit device $110_3$. A third underfill material 176, such as an epoxy material, may be disposed between the second surface $114_1$ of the first integrated circuit device $110_1$ and the first surface $112_3$ of the third integrated circuit device $110_3$ to defined an additional jumping drops vapor chamber 200'.

Figure 10:
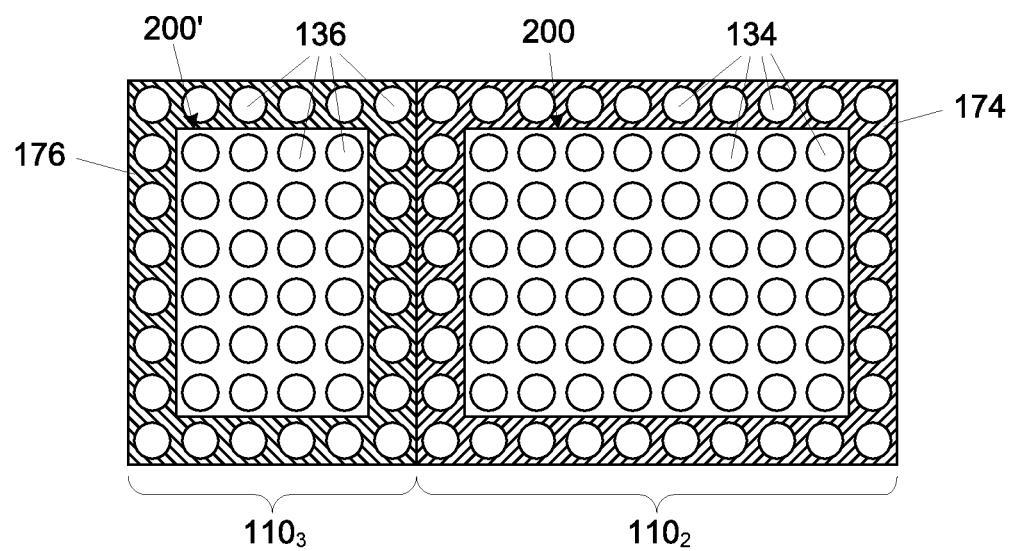
Figure 11:
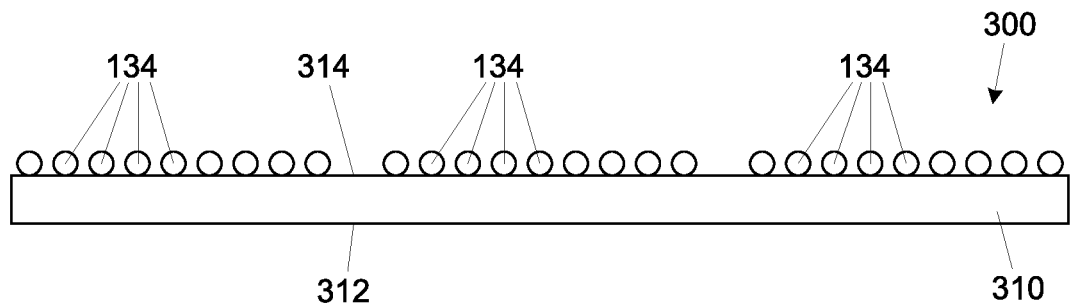
FIGS. 11-16 are side cross-sectional views of a method of fabricating a stacked integrated circuit package, according to another embodiment of the present description.

Although it is understood that the embodiments shown in FIGS. 1-10 may be fabricated in any appropriate manner, FIGS. 11-16 illustrate an exemplary method of fabrication. As shown in FIG. 11, a bumped wafer 300 may be fabricated comprising an integrated circuit wafer 310 having a first surface 312 and an opposing second surface 314, and a plurality of device-to-device interconnects 134 attached to the second surface 314 of the integrated circuit wafer 310, and wherein the hydrophilic evaporation surface (not shown—see element 204 of FIGS. 2 and 3) may be formed or disposed on the second surface 314 of the integrated circuit wafer 310. As will be understood to those skilled in the art, the integrated circuit wafer 310 will have repeating patterns of circuitry for the fabrication of multiple first integrated circuit devices $110_1$ (see FIG. 1).

Figure 12:
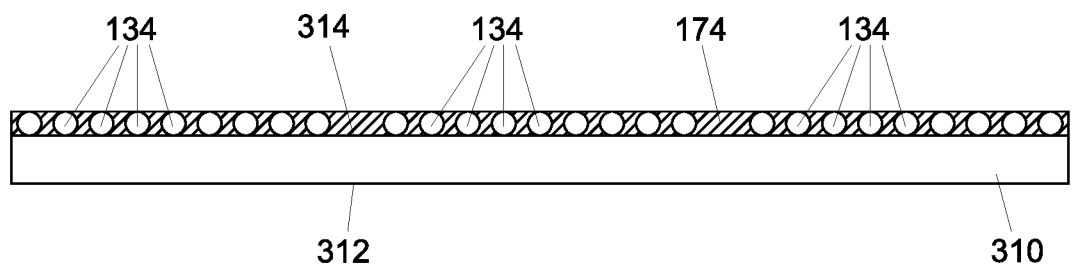
Figure 13:
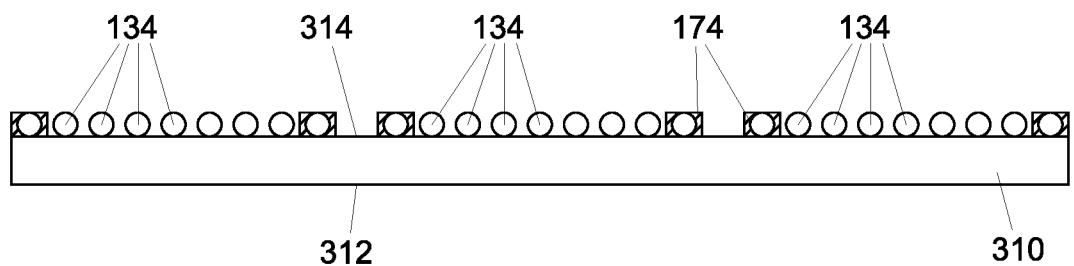
Figure 14:
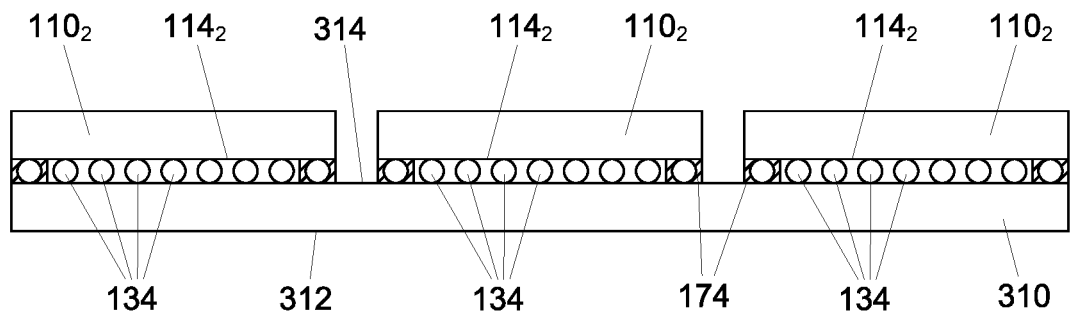
Figure 15:
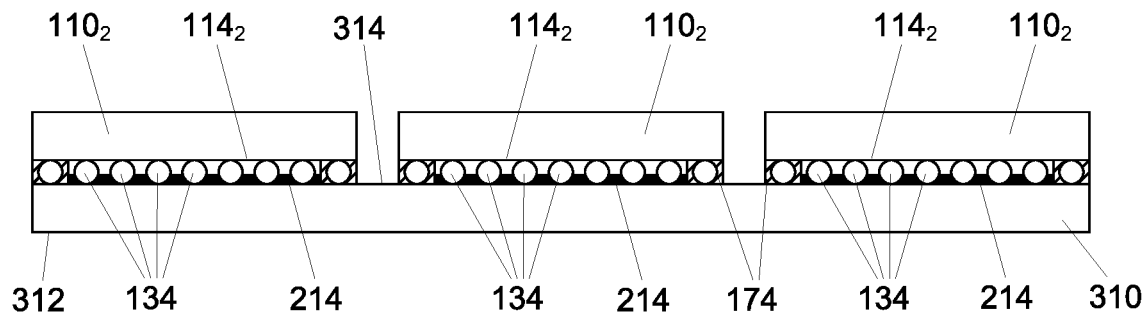
Figure 16:
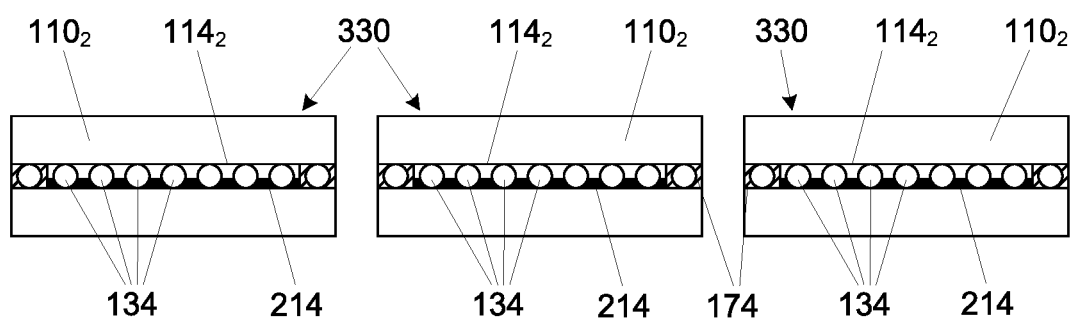

As shown in FIG. 12, the second underfill material 174 may be disposed over the integrated circuit wafer 310 and the plurality of device-to-device interconnects 134. In one embodiment, the second underfill material 174 may be patternable, such as being photo-definable material or through an additional photoresist mask. The second underfill material 174 may then be patterned, such as through photolithography, as shown in FIG. 13. As shown in FIG. 14, a number of second integrated circuit devices $110_2$, each having hydrophobic condensation surfaces (not shown—see element 206 of FIGS. 2 and 3) on the first surface $112_2$ thereof, may be attached to the plurality of device-to-device interconnects 134. The working fluid 214 may be disposed between the first integrated circuit device $110_1$ and the second integrated circuit device $110_2$, as shown in FIG. 15. In one embodiment, the working fluid 214 may be disposed by forming at least one opening (not shown) in the integrated circuit wafer 310, the plurality of device-to-device interconnects 134, and/or the second underfill material 174. The working fluid 214 may be dispensed through the opening(s) (not shown) and the opening(s) (not shown) may be sealed thereafter.

As shown in FIG. 6, the integrated circuit wafer 310 may be cut or singulated into individual die stacks 330, which may be used in form integrated circuit packages, such as the integrated circuit package 100 of FIG. 1.

In one embodiment, the second underfill material 174 may be a photo-definable dielectric, such as polymers with photoactive materials and inorganic fillers, with adhesion promoters, such as silanes, organotitanates, or zircoaluminates, disposed therein. In another embodiment, the second underfill material 174 may be formed by adding photo-sensitive additives, such as benzoin derivative, triphenyl sulfonium nonaflate, to a non-conductive film (NCF). In a further embodiment, the second underfill material 174 may be formed as a thin layer of underfill material on one of the first integrated circuit device $110_1$ and the second integrated circuit device $110_2$, and a thick layer of photo-definable dielectric on the other of the first integrated circuit device $110_1$ and the second integrated circuit device $110_2$. In yet a further embodiment, the second underfill material 174 may be formed by stenciling, screen printing, and/or lithography and controlling its rheology to ensure a good seal between the first integrated circuit device $110_1$ and the second integrated circuit device $110_2$. In still yet another embodiment, the second underfill material 174 may be formed by using a photo-definable dielectric as a flow stopper for a capillary underfill material, as will be understood to those skilled in the art.

Although the method illustrated in FIGS. 11-16 is for an integrated circuit device to an integrated circuit wafer process, the method can be used for an integrated circuit wafer to an integrated circuit wafer process, or an integrated circuit device to an integrated circuit device process, as will be understood to those skilled in the art.

The embodiments of the present description are not limited to having the jumping drops vapor chamber 200 between only the first integrated circuit device $110_1$ and the second integrated circuit device $110_2$, as shown in FIG. 1, or formed on a single level, as shown in FIGS. 9 and 10. Further embodiments of the present description may include additional levels of jumping vapor chambers.

Figure 17:
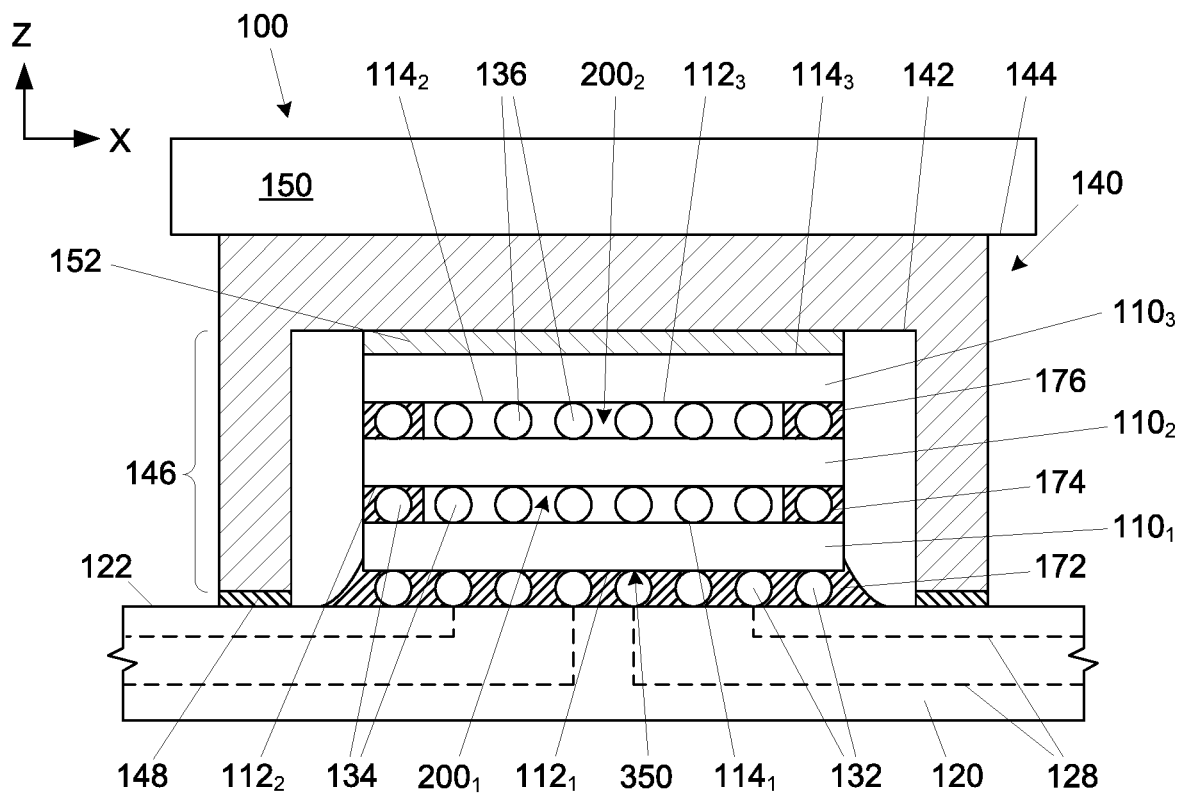
FIG. 17 is a side cross-sectional view of a stacked integrated circuit package having a plurality of jumping drops vapor chambers, wherein the package is attached to a heat dissipation device, according to an embodiment of the present description.

FIG. 17 illustrates an integrated circuit package having stacked integrated circuit devices coupled with a heat dissipation structure. As shown in FIG. 17, an integrated circuit package 350 may comprise a plurality of integrated circuit devices (illustrated as the first integrated circuit device $110_1$, the second integrated circuit device $110_2$, and the third integrated circuit device $110_3$) attached to the substrate 120. In one embodiment, the first integrated circuit device $110_1$ may be attached to a first surface 122 of the substrate 120 through the plurality of device-to-substrate interconnects 132. The device-to-substrate interconnects 132 may extend from bond pads (not shown) on a first surface $112_1$ of the first integrated circuit device $110_1$ and bond pads (not shown) on the first surface 122 of the substrate 120.

The second integrated circuit device $110_2$ may be attached to the second surface $114_1$ of the first integrated circuit device $110_1$ through a plurality of device-to-device interconnects 134. The device-to-device interconnects 134 may extend from bond pads (not shown) on a first surface $112_2$ of the second integrated circuit device $110_2$ and bond pads (not shown) on the second surface $114_1$ of the first integrated circuit device $110_1$. The bond pads (not shown) on the second surface $114_1$ of the first integrated circuit device $110_1$ may be in electrical communication with integrated circuitry (not shown) and/or through-silicon vias (not shown) within the first integrated circuit device $110_1$. The bond pads (not shown) on the first surface $112_2$ of the second integrated circuit device $110_2$ may be in electrical communication with integrated circuitry (not shown) within the second integrated circuit device $110_2$.

The third integrated circuit device $110_3$ may be attached to the second surface $114_2$ of the second integrated circuit device $110_2$ through the plurality of device-to-device interconnects 136. The device-to-device interconnects 136 may extend from bond pads (not shown) on a first surface $112_3$ of the third integrated circuit device $110_3$ and bond pads (not shown) on the second surface $114_2$ of the second integrated circuit device $110_2$. The bond pads (not shown) on the second surface $114_2$ of the second integrated circuit device $110_2$ may be in electrical communication with integrated circuitry (not shown) and/or through-silicon vias (not shown) within the second integrated circuit device $110_2$. The bond pads (not shown) on the first surface $112_3$ of the third integrated circuit device $110_3$ may be in electrical communication with integrated circuitry (not shown) within the third integrated circuit device $110_3$.

As further illustrated in FIG. 17 and according to one embodiment of the present description, a heat dissipation device 140, such as a heat spreader, may be thermally coupled with a second surface $114_3$ (opposing the first surface $112_3$) of the third integrated circuit device $110_3$. In one embodiment, the heat dissipation device 140 may have a first surface 142 and an opposing second surface 144, wherein the first surface 142 of the heat dissipation device 140 is thermally coupled to the second surface $114_3$ of the third integrated circuit device $110_3$ with the thermal interface material 152, such as a grease or polymer, to facilitate heat transfer therebetween. As further shown in FIG. 17, the second surface 144 of the heat dissipation device 140 may be in thermal contact with the active heat removal device 150 (shown as a generic block), as previously discussed with regard to FIG. 1

In one embodiment of the present description, the heat dissipation device 140 may include at least one footing 146 extending between the first surface 142 of the heat dissipation device 140 and the first surface 122 of the substrate 120, wherein the heat dissipation device footing 146 may be attached to the first surface 122 of the substrate 120 with the attachment adhesive or sealant layer 148.

It is further understood that the first underfill material 172 may be disposed between the first surface $112_1$ of the integrated circuit device $110_1$ and the first surface 122 of the substrate 120 and may surround the plurality of device-to-substrate interconnects 132.

A first jumping drops vapor chamber $200_1$ may be formed between the second surface $114_1$ of the first integrated circuit device $110_1$ and the first surface $112_2$ of the second integrated circuit device $110_2$. In one embodiment, at least one of the device-to-device interconnects 134 extends through the first jumping drops vapor chamber $200_1$. In another embodiment, the second underfill material 174, such as an epoxy material, may be disposed between the second surface $114_1$ of the first integrated circuit device $110_1$ and the first surface $112_2$ of the second integrated circuit device $110_2$ to defined the first jumping drops vapor chamber $200_1$, as has been discussed. In a further embodiment, the second underfill material 174 may surround at least one device-to-device interconnects 134.

A second jumping drops vapor chamber $200_2$ may be formed between the second surface $114_2$ of the second integrated circuit device $110_2$ and the first surface $112_3$ of the third integrated circuit device $110_3$. In one embodiment, at least one of the device-to-device interconnects 136 extends through the second jumping drops vapor chamber $200_2$. In another embodiment, the third underfill material 176 may be disposed between the second surface $114_2$ of the second integrated circuit device $110_2$ and the first surface $112_3$ of the third integrated circuit device $110_3$ to defined the second jumping drops vapor chamber $200_2$, as has been discussed. In a further embodiment, the third underfill material 176 may surround at least one device-to-device interconnects 136.

Figure 18:
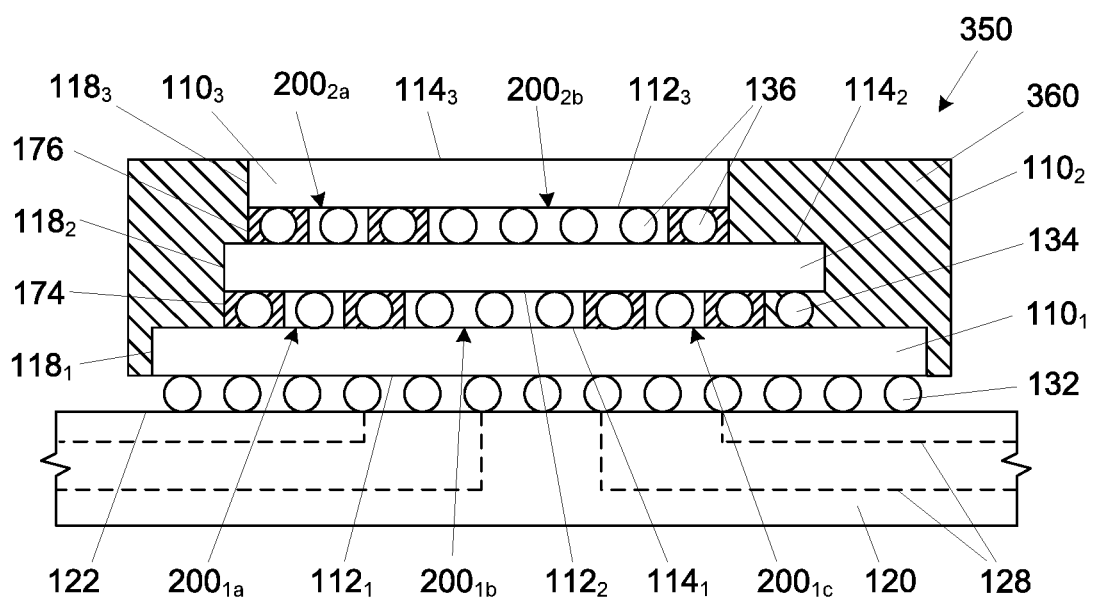
FIGS. 18-20 are side cross-sectional views of different stacked integrated circuit packages having a plurality of jumping drops vapor chambers, wherein the packages are embedded in a mold material, according to various embodiments of the present description.

As previously discussed, reducing the underfill material between integrated circuit devices to form jumping drops vapor chambers can reduce the structural integrity of the integrated circuit; thus, some embodiments of the present description may include the integrated circuit devices at least partially encapsulated in a mold material to provide structural integrity. As shown in FIG. 18, a mold material 360 may contact each of the integrated circuit devices $110_1$, $110_2$, and $110_3$ to form the integrated circuit package 350. In one embodiment, the mold material 360 may contact at least one side $118_1$, $118_2$, and $118_3$ of at least one of the integrated circuit devices $110_1$, $110_2$, an $110_3$, respectively. In one embodiment, as shown in FIG. 18, the mold material 360 may contact the sides $118_1$, $118_2$, and $118_3$ of each of the integrated circuit devices $110_1$, $110_2$, an $110_3$. As shown in FIG. 18, their may be a variety of jumping drops vapor chambers formed, which are shown as elements $200_{1a}$, $200_{1b}$, and $200_{1c}$ between the first integrated circuit device $110_1$ and the second integrated circuit device $110_2$, and as element $200_{2a}$ and $200_{2b}$ between the second integrated circuit device $110_2$ and the third integrated circuit device $110_3$. In a further embodiment, the second surface $114_3$ of the third integrated circuit device $110_3$ may be exposed through the mold material 360 for the subsequent attachment of a heat dissipation device, such as element 140 in FIG. 17.

Figure 19:
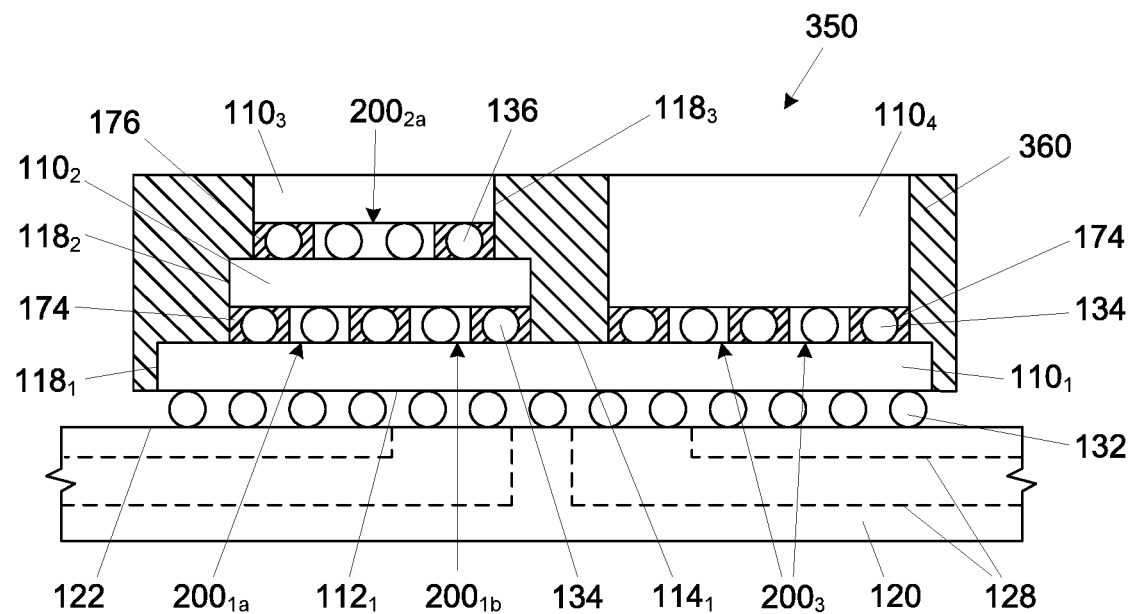
Figure 20:
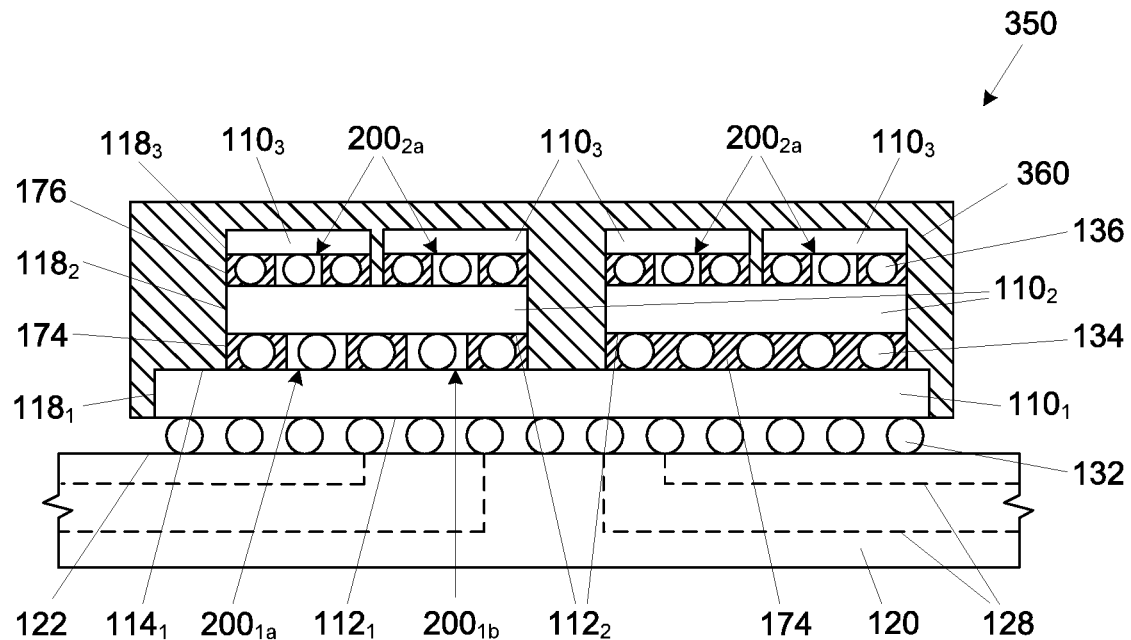

In further embodiments of the present description, the integrated circuit devices may have any size or configuration. As shown in FIG. 19, the integrated circuit package 350 may include a relatively large integrated circuit device $110_4$ extending through the mold material 360 from the second surface $114_1$ for the first integrated circuit device $110_1$, wherein at least one jumping drops vapor chamber $200_3$ formed between the integrated circuit device $110_4$ and the second surface $114_1$ for the first integrated circuit device $110_1$. As shown in FIG. 20, the third integrated circuit device $110_3$ may be relatively smaller than the other integrated circuit devices $110_1$ and $110_2$, such that multiple third integrated circuit devices $110_3$ may be stacked on the second integrated circuit devices $110_2$. Additionally, as further illustrated in FIG. 20, a jumping drops vapor chamber need not be formed between each stack of integrated circuit devices. As further illustrated in FIG. 20, no jumping drops vapor chamber is formed between the first integrated circuit device $110_1$ and the second integrated circuit device $110_2$ on the right-hand side.

Figure 21:
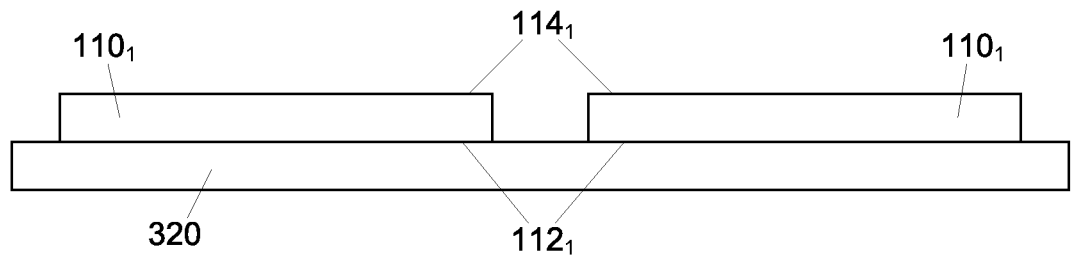
FIGS. 21-26 are cross-sectional views of a method of fabricating a stacked integrated circuit package, according to another embodiment of the present description.
Figure 22:
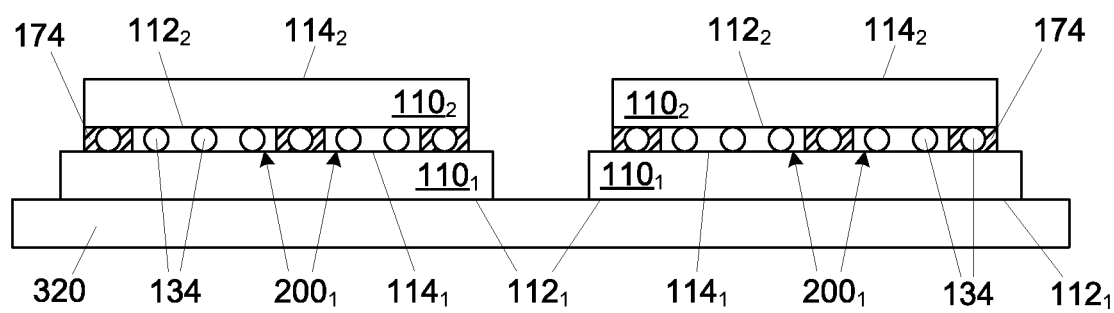

Although it is understood that the embodiments shown in FIGS. 17-20 may be fabricated in any appropriate manner, FIGS. 21-26 illustrate an exemplary method of fabrication. As shown in FIG. 21, a first surface $112_1$ of each of the plurality of first integrated circuit devices $110_1$ may be attached, such as by an adhesive, to a carrier 320, and the hydrophilic evaporation surface (not shown—see element 204 in FIGS. 2 and 3) may be formed on the second surface $114_1$. As shown in FIG. 22, the plurality of device-to-device interconnects 134 may be attached to the second surfaces $114_1$ of the first integrated circuit devices $110_1$ and the second underfill material 174 patterned thereon. A plurality of second integrated circuit devices $110_2$, each of which has the hydrophobic condensation surface (not shown—see element 206 of FIGS. 2 and 3) formed on the first surface $112_2$ thereof, may be attached to respective first integrated circuit devices $110_1$ with the plurality of device-to-device interconnects 134. The working fluid (not shown—see element 214 of FIGS. 2 and 3) may be disposed between the first integrated circuit device $110_1$ and the second integrated circuit device $110_2$, to form first jumping drops vapor chambers $200_1$, as previously discussed.

Figure 23:
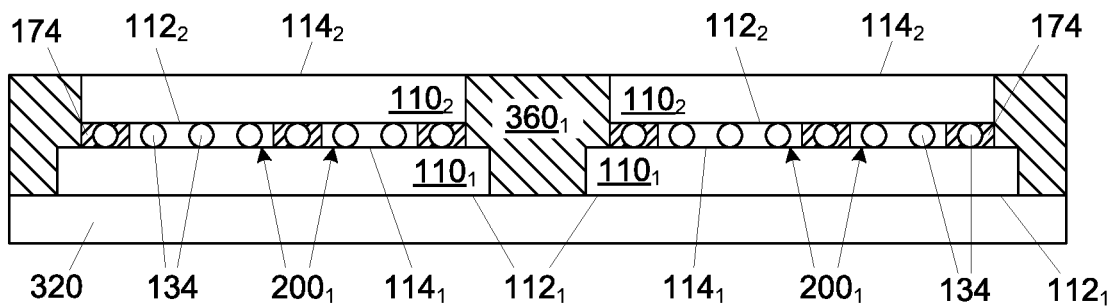

As shown in FIG. 23, a first mold material layer $360_1$ may be formed over the first integrated circuit device $110_1$ and the second integrated circuit device $110_2$, and ground/ablated to expose the second surfaces $114_2$ of the second integrated circuit devices $110_2$. The hydrophilic evaporation surface (not shown—see element 204 of FIGS. 2 and 3) may then be formed on the second surface $114_2$ of the second integrated circuit devices $110_2$.

Figure 24:
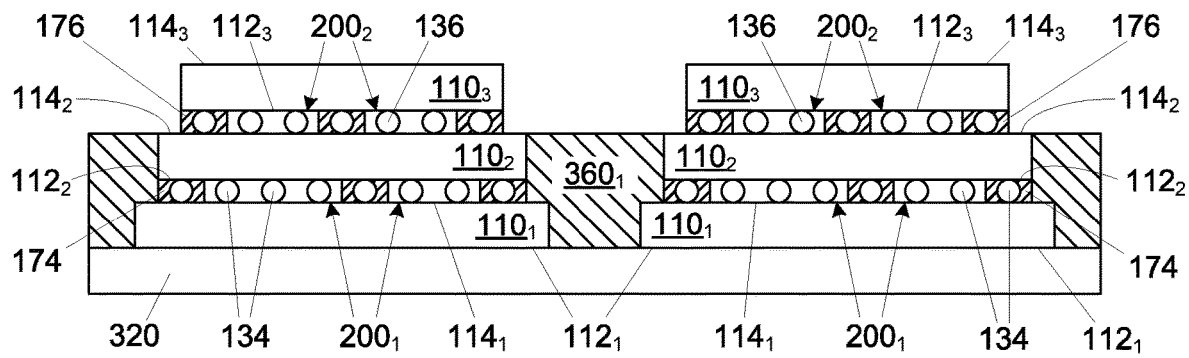

As shown in FIG. 24, the plurality of device-to-device interconnects 136 may be attached to the second surfaces $114_2$ of the second integrated circuit devices $110_2$ and the third underfill material 176 patterned thereon. A third integrated circuit device $110_3$, which has the hydrophobic condensation surface (not shown—see element 206 of FIGS. 2 and 3) formed on the first surface $112_3$ thereof, may be attached to respective second integrated circuit devices $110_2$ with the plurality of device-to-device interconnects 136. The working fluid (not shown—see element 214 FIGS. 2 and 3) may be disposed between the second integrated circuit device $110_2$ and the third integrated circuit device $110_3$ to form the second jumping drops vapor chambers $200_2$, in a manner previously discussed.

Figure 25:
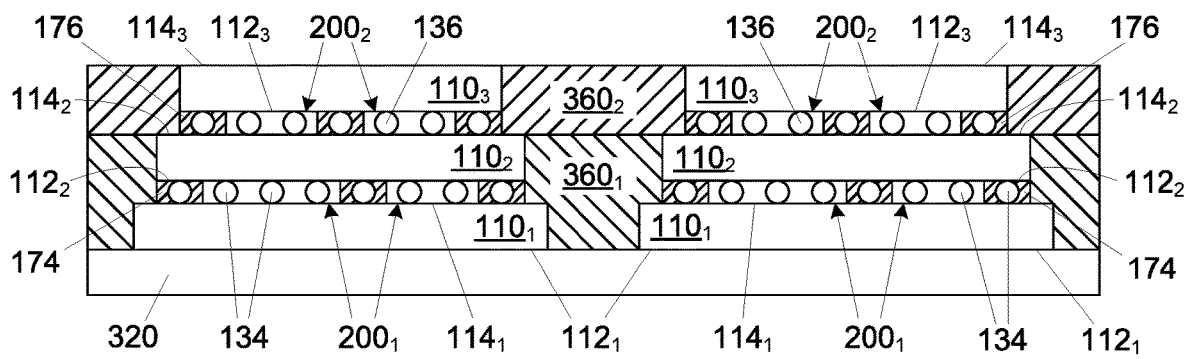
Figure 26:
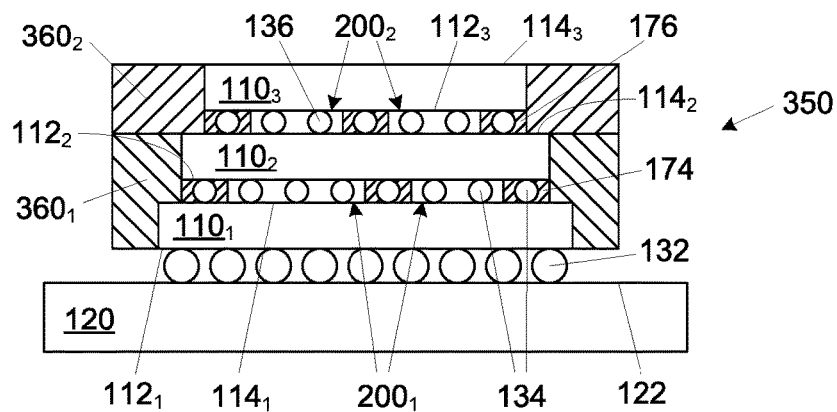

As shown in FIG. 25, a second mold material layer $360_2$ may be formed over the third integrated circuit device $110_3$, and ground/ablated to expose the second surfaces $114_3$ of the third integrated circuit devices $110_3$. The first mold material layer $360_1$ and the second mold material layer $360_2$ may be cut or singulated into individual integrated circuit packages 350, removed from the carrier 320 (see FIG. 25), and attached to the substrate 120 with the plurality of device-to-substrate interconnects 132, as shown in FIG. 26.

Figure 27:
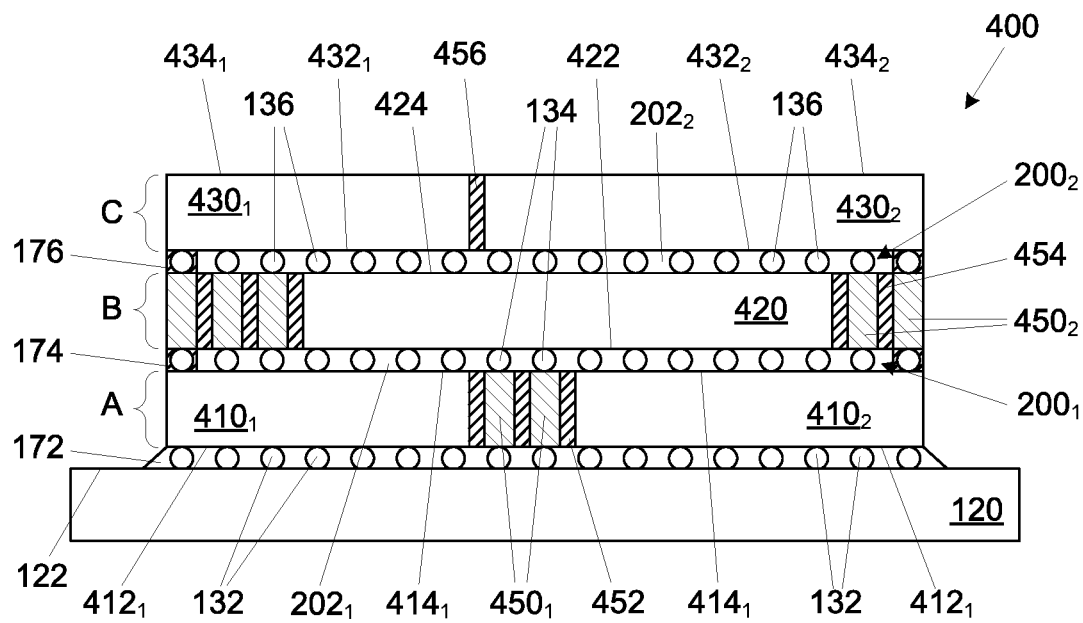
FIG. 27 is a side cross-sectional view of a stacked integrated circuit package having a plurality of jumping drops vapor chambers, wherein the package including conductive pillars to form electrical contacts, according to one embodiment of the present description.

FIG. 27 illustrates an integrated circuit package having stacked integrated circuit devices according to another embodiment of the present description. As shown in FIG. 27, an integrated circuit package 400 may comprise a plurality of integrated circuit devices (illustrated as two first level integrated circuit devices $410_1$ and $410_2$, one second level integrated circuit device 420, and two third level integrated circuit devices $430_1$ and $430_1$) attached to the substrate 120. In one embodiment, the two first level integrated circuit devices $410_1$ and $410_2$ may be attached to the first surface 122 of the substrate 120 through the plurality of device-to-substrate interconnects 132. The device-to-substrate interconnects 132 may extend from bond pads (not shown) on first surfaces $412_1$ and $412_2$, respectively, of the first level integrated circuit devices $410_1$ and $410_2$ and bond pads (not shown) on the first surface 122 of the substrate 120.

The second level integrated circuit device 420 may be attached to second surfaces $414_1$ and $414_2$ of the first level integrated circuit devices $410_1$ and $410_2$, respectively, through a plurality of device-to-device interconnects 134. The device-to-device interconnects 134 may extend from bond pads (not shown) on a first surface 422 of the second level integrated circuit device 420 and bond pads (not shown) on the second surfaces $414_1$ and $414_2$ of the first level integrated circuit devices $410_1$ and $410_2$, respectively. The bond pads (not shown) on the second surfaces $414_1$ and $414_2$ of the first level integrated circuit devices $410_1$ and $410_2$, respectively, may be in electrical communication with integrated circuitry (not shown) and/or through-silicon vias (not shown) within the first level integrated circuit devices $410_1$ and $410_2$. The bond pads (not shown) on the first surface 422 of the second level integrated circuit device 420 may be in electrical communication with integrated circuitry (not shown) within the second level integrated circuit device 420.

As further shown in FIG. 27, a plurality of first level conductive pillars $450_1$ may extend between a layer of first level dielectric material 452 positioned between the two first level integrated circuit device $410_1$ and $410_2$. Respective device-to-device interconnects 134 may connect the second level integrated circuit device 420 to the plurality of first level conductive pillars $450_1$ and respective device-to-substrate interconnects 132 may connect the plurality of first level conductive pillars $450_1$ to the substrate 120. Thus, the second level integrated circuit device 420 may be directly connected with the substrate 120.

The third level integrated circuit devices $430_1$ and $430_2$ may be attached to the second surface 424 of the second level integrated circuit device 420 through the plurality of device-to-device interconnects 136. The device-to-device interconnects 136 may extend from bond pads (not shown) on first surfaces $432_1$ and $432_2$ of the third integrated circuit devices $430_1$ and $430_2$, respectively, and bond pads (not shown) on the second surface 424 of the second level integrated circuit device 420. The bond pads (not shown) on the second surface 424 of the second level integrated circuit device 420 may be in electrical communication with integrated circuitry (not shown) and/or through-silicon vias (not shown) within the second level integrated circuit device 420. The bond pads (not shown) on the first surfaces $112_3$ of the third level integrated circuit devices $430_1$ and $430_2$ may be in electrical communication with integrated circuitry (not shown) within the third level integrated circuit devices $430_1$ and $430_2$, respectively.

As further shown in FIG. 27, the plurality of second level conductive pillars $450_2$ may extend between a layer of second level dielectric material 454 positioned adjacent the second level integrated circuit device 420 (shown on opposing sides thereof). Respective device-to-device interconnects 136 may connect the third level integrated circuit devices $430_1$ and $430_2$ to the plurality of second level conductive pillars $450_2$ and respective device-to-device interconnects 134 may connect the plurality of second level conductive pillars $450_2$ to the respective first level integrated circuit devices $410_1$ and $410_2$. Thus, the third level integrated circuit devices $430_1$ and $430_2$ may be directly connected with respective first level integrated circuit devices $410_1$ and $410_2$. Any gaps between the third level integrated circuit devices $430_1$ and $430_2$ may be filled with a dielectric material 456.

A first jumping drops vapor chamber $200_1$ may be formed between the second surfaces $414_1$ and $414_2$ of the first level integrated circuit devices $410_1$ and $410_2$, respectively, and the first surface 422 of the second level integrated circuit device 420. The jumping drops vapor chamber $200_1$ may comprise a vapor space $202_1$, which may be sealed, defined by a hydrophilic evaporation surface (not specifically shown) formed on or in the second surfaces $414_1$ and $414_2$ of the first level integrated circuit devices $410_1$ and $410_2$, respectively, an opposing hydrophobic condensation surface (not specifically shown) formed on the first surface 422 of the second level integrated circuit device 420, and at least one sidewall 212, wherein the working fluid (not specifically shown) is disposed within the vapor space $202_1$. In one embodiment, the second underfill material 174, such as an epoxy material, may be disposed between a first level A of integrated circuit devices (i.e. first level integrated circuit devices $410_1$, $410_2$) and a second level B of integrated circuit devices (i.e. second level integrated circuit device 420) to define the first jumping drops vapor chamber $200_1$. In a further embodiment, the second underfill material 174 may surround at least one device-to-device interconnects 134. In one embodiment, at least one of the device-to-device interconnects 134 extends through the first jumping drops vapor chamber $200_1$. In an embodiment, the first underfill material 172 may be disposed between the substrate 120 and the first level A of integrated circuit devices.

A second jumping drops vapor chamber $200_2$ may be formed between the second surface 424 of the second level integrated circuit device 420 and the first surfaces $432_1$ and $432_2$ of the third level integrated circuit devices $430_1$ and $430_2$, respectively. The jumping drops vapor chamber $200_1$ may comprise a vapor space $202_1$, which may be sealed, defined by a hydrophobic condensation surface (not specifically shown) formed on or in the first surfaces $432_1$ and $432_2$ of the third level integrated circuit devices $430_1$ and $430_2$, respectively, an opposing hydrophilic evaporation surface (not specifically shown) formed on the second surface 424 of the second level integrated circuit device 420, and at least one sidewall $212_2$, wherein the working fluid (not specifically shown) is disposed within the vapor space $202_2$. In one embodiment, the third underfill material 176, such as an epoxy material, may be disposed between a third level C of integrated circuit devices (i.e. third level integrated circuit devices $430_1$, $430_2$) and a second level B of integrated circuit devices (i.e. second level integrated circuit device 420) to define the second jumping drops vapor chamber $200_2$. In a further embodiment, the third underfill material 176 may surround at least one device-to-device interconnects 134. In one embodiment, at least one of the device-to-device interconnects 134 extends through the second jumping drops vapor chamber $200_2$.

Figure 28:
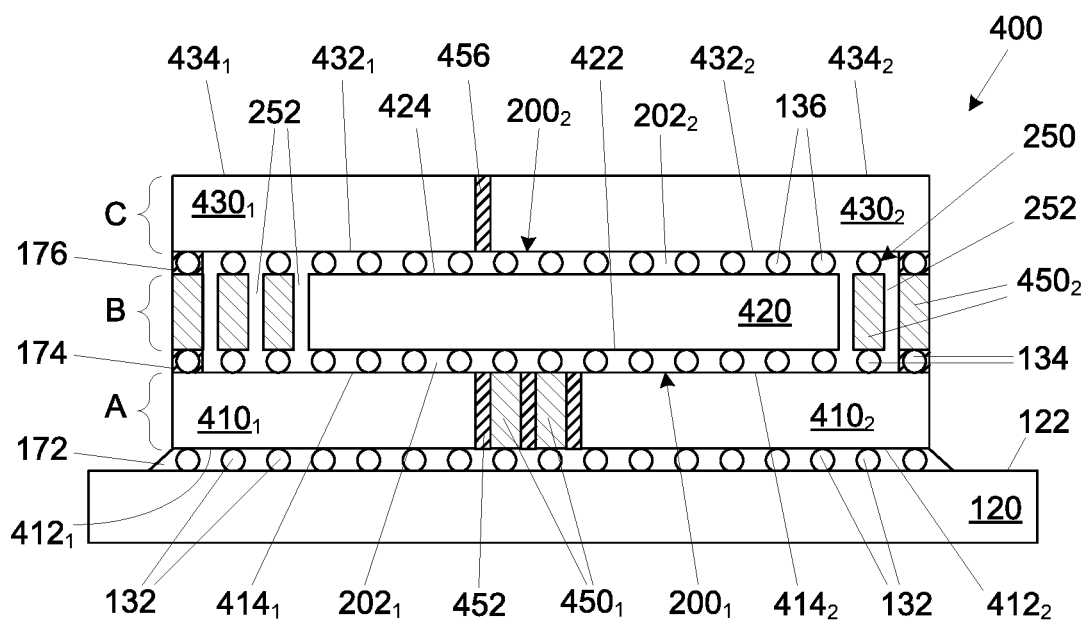
FIG. 28 is a side cross-sectional view of the stacked integrated circuit package of FIG. 27, wherein the jumping drops vapor chambers are in fluid communication with one another, according to another embodiment of the present description.

In further embodiments, at least one jumping drops vapor chamber may be formed which extends between different levels of the stacked integrated circuit devices. As shown in FIG. 28, the integrated circuit package 400 of FIG. 27 may include a conduit 252 extending between the first jumping drops vapor chamber $200_1$ and the second jumping drops vapor chamber $200_2$, which places the first jumping drops vapor chamber $200_1$ and the second jumping drops vapor chamber $200_2$ in fluid communication and forms a single multilevel jumping drops vapor chamber 250 with a shared work fluid (not shown—see element 214 of FIG. 2).

Figure 29:
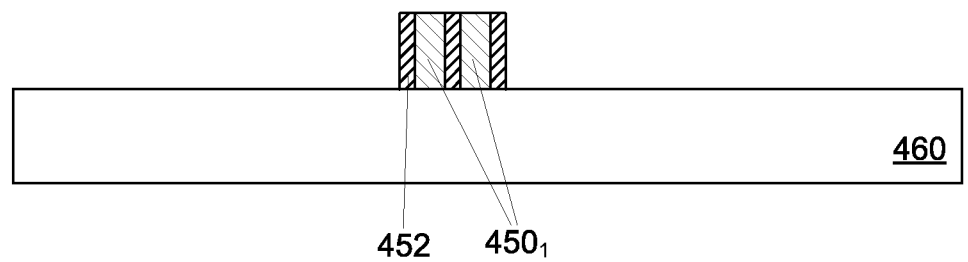
FIGS. 29-34 are cross-sectional views of a method of fabricating the stacked integrated circuit package of FIG. 28, according to one embodiment of the present description.
Figure 30:
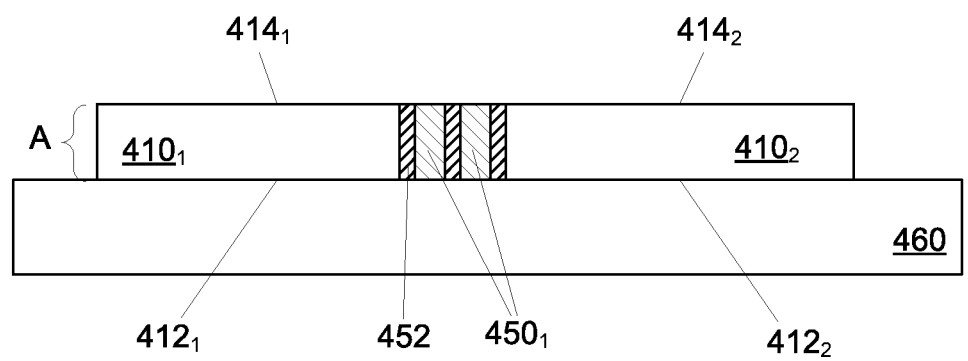
Figure 31:
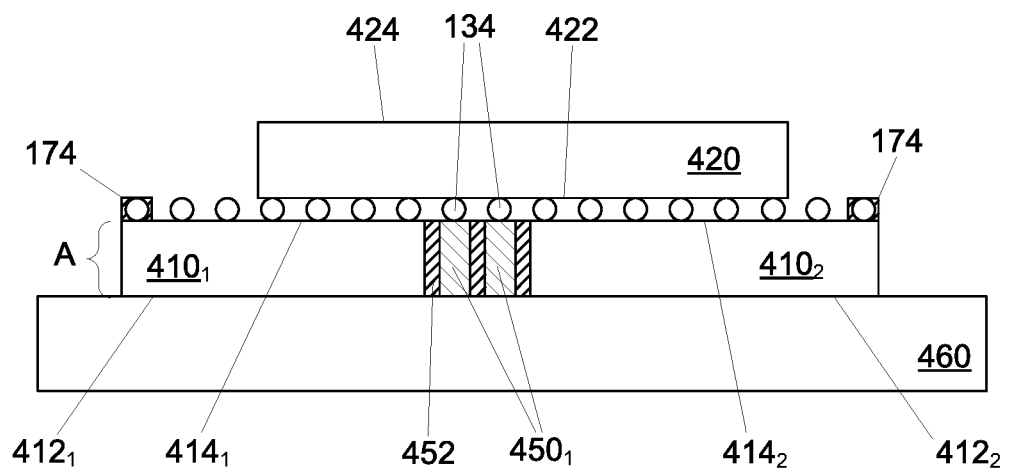

Although it is understood that the embodiments shown in FIG. 28 may be fabricated in any appropriate manner, FIGS. 29-34 illustrate an exemplary method of fabrication. As shown in FIG. 29, a carrier 460 may be provided wherein the plurality of first level conductive pillars $450_1$ are formed by any appropriate manner thereon. The photo-definable first level dielectric material 452 may be laminated over the carrier 460, exposed, and developed to pattern the first level dielectric material 452 adjacent the first level conductive pillars $450_1$. As shown in FIG. 30, the first surfaces $412_1$ and $412_2$ of each of a plurality of first level integrated circuit devices $410_1$ and $401_2$, respectively, may be attached adjacent the first level conductive pillars $450_1$ and first level dielectric material 452, such as by an adhesive, to the carrier 460, and the hydrophilic evaporation surface (not shown—see element 204 of FIGS. 2 and 3) may be formed on the second surfaces $414_1$ and $414_2$ of each of the first level integrated circuit devices $410_1$ and $410_2$, respectively. As shown in FIG. 31, the plurality of device-to-device interconnects 134 may be attached to the second surfaces $414_1$ and $414_2$ of the first level integrated circuit devices $410_1$ and $410_2$, respectively, and the second underfill material 174 patterned thereon. The second level integrated circuit device 420, which has the hydrophobic condensation surface (not shown—see element 206 of FIGS. 2 and 3) formed on the first surface $412_2$ thereof, may be attached to respective first level integrated circuit devices $410_1$ with the plurality of device-to-device interconnects 134.

Figure 32:
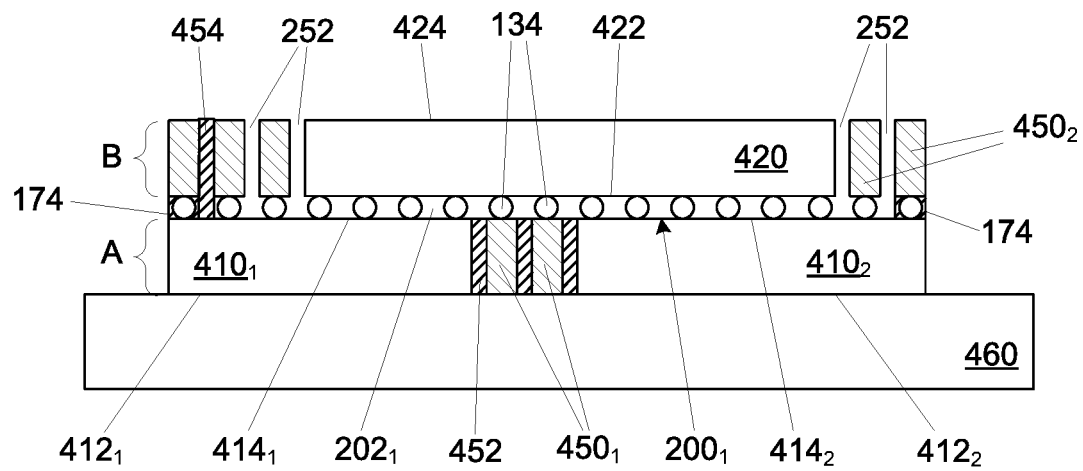

As shown in FIG. 32, second level conductive pillars $450_2$ and second level dielectric material 454 may be patterned adjacent the second level integrated circuit device 420. The patterning of the second dielectric material 454 forms the conduit 252. The hydrophilic evaporation surface (not shown—see element 204 of FIGS. 2 and 3) may then be formed on the second surface 424 of the second level integrated circuit device 420.

Figure 33:
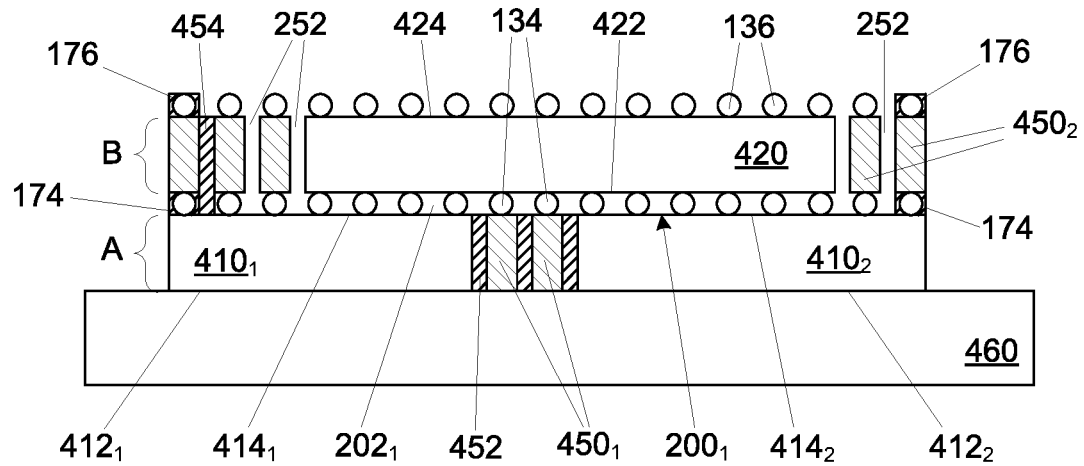

As shown in FIG. 33, the plurality of device-to-device interconnects 136 may be attached to the second surface 424 of the second level integrated circuit device 420. The plurality of device-to-device interconnects 136 may also be attached to the second level conductive pillars $450_2$ and the third underfill material 176 patterned thereon.

Figure 34:
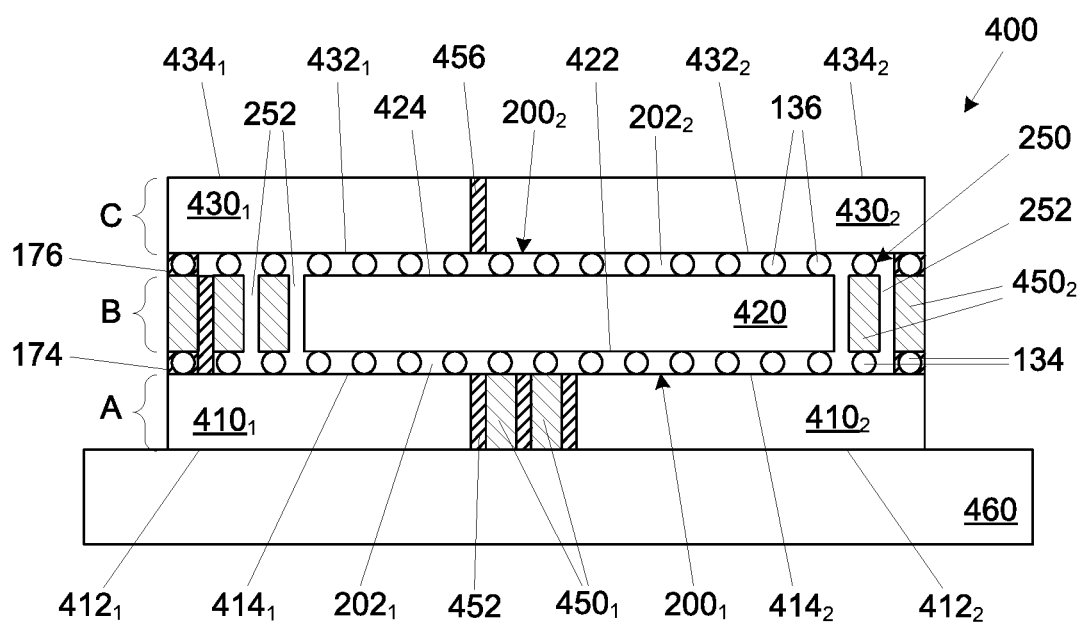

As shown in FIG. 34, the third level integrated circuit devices $430_1$ and $430_2$, which have the hydrophobic condensation surface (not shown—see element 206 of FIGS. 2 and 3) formed on the first surfaces $432_1$ and $432_2$ thereof, may be attached to the second level integrated circuit device 420 and the second level conductive pillars $450_2$ with the plurality of device-to-device interconnects 136. Any gaps between the third level integrated circuit devices $430_1$ and $430_2$ may be filled with a dielectric material 456. The working fluid (not shown—see element 214 of FIGS. 2 and 3) may be disposed within the multilevel jumping drops vapor chamber 250.

Figure 35:
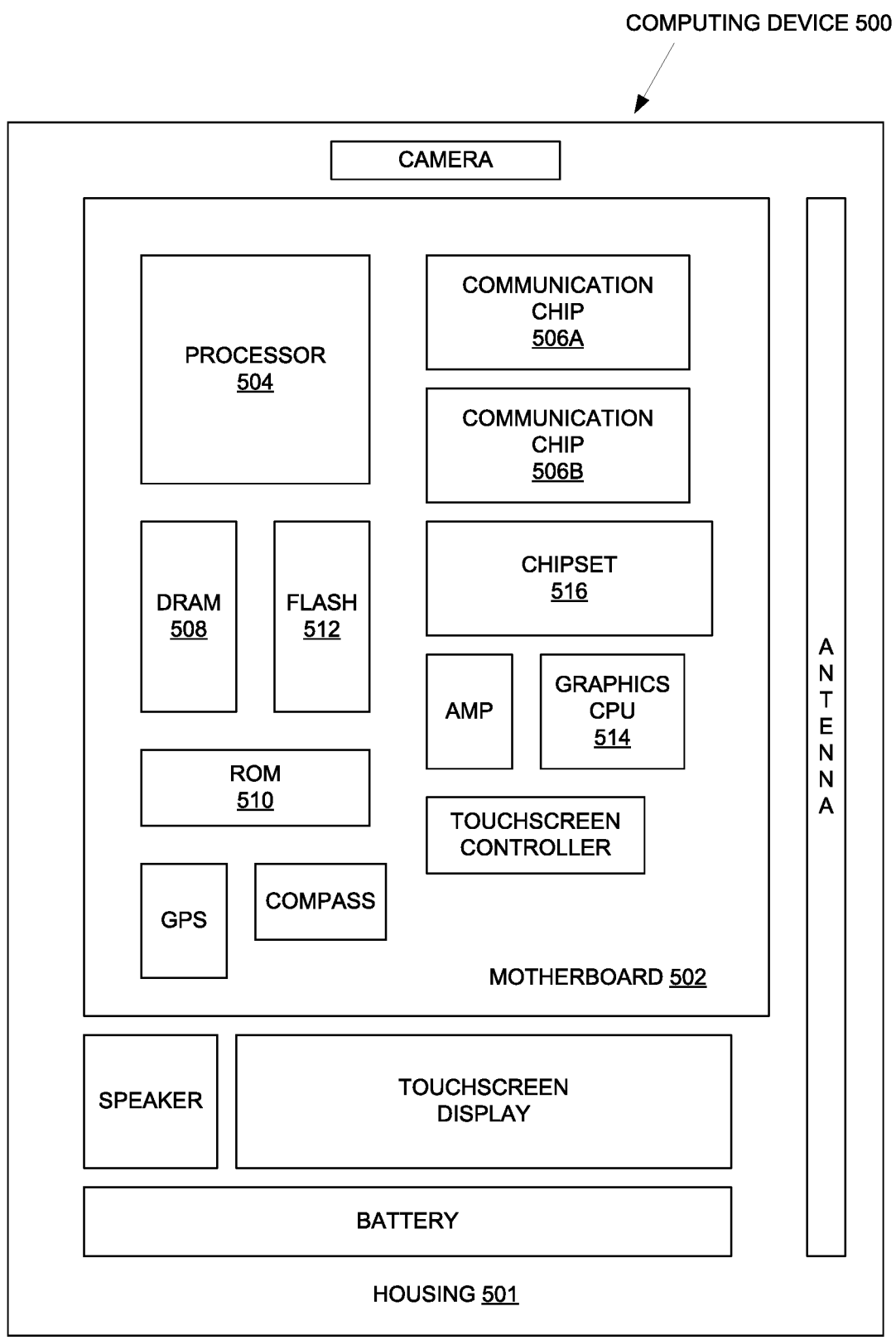
FIG. 35 is an electronic device/system, according to an embodiment of the present description.

FIG. 35 illustrates an electronic or computing device 500 in accordance with one implementation of the present description. The computing device 500 may include a housing 501 having a board 502 disposed therein. The board 502 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit structure comprising a first integrated circuit device, a second integrated circuit device electrically coupled to the first integrated circuit device with a plurality of device-to-device interconnects, and at least one jumping drops vapor chamber between the first integrated circuit device and the second integrated circuit device wherein at least one of the plurality of device-to-device interconnects extends through the jumping drops vapor chamber.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-35. The subject matter may be applied to other integrated circuit devices and assembly applications, as well as any appropriate electronic application, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit structure, comprising:
   a first integrated circuit device;
   a second integrated circuit device electrically coupled to the first integrated circuit device with a first plurality of device-to-device interconnects;
   at least one first jumping drops vapor chamber between the first integrated circuit device and the second integrated circuit device, wherein at least one device-to-device interconnect of the first plurality of device-to-device interconnects extends through the at least one first jumping drops vapor chamber;
   a third integrated circuit device electrically coupled to the second integrated circuit device with a second plurality of device-to-device interconnects;
   at least one second jumping drops vapor chamber between the second integrated circuit device and the third integrated circuit device, wherein at least one device-to-device interconnect of the second plurality of device-to-device interconnects extends through the at least one second jumping drops vapor chamber; and
   at least one conduit connecting the at least one first jumping drops vapor chamber and the at least one second jumping drops vapor chamber, wherein the at least one first jumping drops vapor chamber and the at least one second jumping drops vapor chamber share a work fluid via the conduit.

2. The integrated circuit structure of claim 1, wherein the first integrated circuit device is electrically coupled to the third integrated circuit device.

3. The integrated circuit structure of claim 2, wherein the first integrated circuit device is electrically coupled to the third integrated circuit device through at least one conductive pillar extending between a respective device-to-device interconnect of the first plurality of device-to-device interconnects and a respective device-to-device interconnect of the second plurality of device-to-device interconnects.

4. The integrated circuit structure of claim 1, wherein at least one device-to-device interconnect of either the first plurality of device-to-device interconnects and the second plurality of device-to-device interconnects comprise solder.

5. An integrated circuit package, comprising:
   a substrate;
   a first integrated circuit device electrically coupled to the substrate with a plurality of device-to-substrate interconnects;
   a second integrated circuit device electrically coupled to the first integrated circuit device with a first plurality of device-to-device interconnects;
   at least one first jumping drops vapor chamber between the first integrated circuit device and the second integrated circuit device, wherein at least one device-to-device interconnect of the first plurality of device-to-device interconnects extends through the at least one first jumping drops vapor chamber;
   a third integrated circuit device electrically coupled to the second integrated circuit device with a second plurality of device-to-device interconnects;
   at least one second jumping drops vapor chamber between the second integrated circuit device and the third integrated circuit device, wherein at least one device-to-device interconnect of the second plurality of device-to-device interconnects extends through the at least one second jumping drops vapor chamber; and
   at least one conduit connecting the at least one first jumping drops vapor chamber and the at least one second jumping drops vapor chamber, wherein the at least one first jumping drops vapor chamber and the at least one second jumping drops vapor chamber share a work fluid via the conduit.

6. The integrated circuit package of claim 5, wherein the first integrated circuit device is electrically coupled to the third integrated circuit device.

7. The integrated circuit package of claim 5, wherein the first integrated circuit device is electrically coupled to the third integrated circuit device through at least one conductive pillar extending between a respective device-to-device interconnect of the first plurality of device-to-device interconnects and a respective device-to-device interconnect of the second plurality of device-to-device interconnects.

8. The integrated circuit package of claim 5, wherein the second integrated circuit device is electrically coupled to the substrate.

9. The integrated circuit package of claim 8, wherein the second integrated circuit device is electrically coupled to the substrate through at least one conductive pillar extending between a respective device-to-device interconnect of the first plurality of device-to-device interconnects and a respective device-to-substrate interconnect.

10. The integrated circuit package of claim 9, wherein the at least one conductive pillar extends through a dielectric material.

11. The integrated circuit package of claim 5, wherein at least one device-to-device interconnect of either the first plurality of device-to-device interconnects and the second plurality of device-to-device interconnects comprise solder.

12. An electronic system, comprising:
   a housing;
   a board in the housing;

a first integrated circuit device electrically coupled to the board with a plurality of device-to-substrate interconnects;

a second integrated circuit device electrically coupled to the first integrated circuit device with a plurality of device-to-device interconnects;

at least one first jumping drops vapor chamber between the first integrated circuit device and the second integrated circuit device, wherein at least one device-to-device interconnect of the plurality of device-to-device interconnects extends through the at least one first jumping drops vapor chamber;

a third integrated circuit device electrically coupled to the second integrated circuit device with a plurality of device-to-device interconnects;

at least one second jumping drops vapor chamber between the second integrated circuit device and the third integrated circuit device, wherein at least one device-to-device interconnect of the plurality of device-to-device interconnects extends through the at least one second jumping drops vapor chamber; and at least one conduit connecting the at least one first jumping drops vapor chamber and the at least one second jumping drops vapor chamber, wherein the at least one first jumping drops vapor chamber and the at least one second jumping drops vapor chamber share a work fluid via the conduit.

13. The electronic system of claim 12, wherein the first integrated circuit device is electrically coupled to the third integrated circuit device.

14. The electronic system of claim 13, wherein the first integrated circuit device is electrically coupled to the third integrated circuit device through at least one conductive pillar extending between a respective device-to-device interconnect of the first plurality of device-to-device interconnects and a respective device-to-device interconnect of the second plurality of device-to-device interconnects.

15. The electronic system of claim 12, wherein the second integrated circuit device is electrically coupled to the substrate.

16. The electronic system of claim 15, wherein the second integrated circuit device is electrically coupled to the substrate through at least one conductive pillar extending between a respective device-to-device interconnect of the first plurality of device-to-device interconnects and a respective device-to-substrate interconnect.

17. The electronic system of claim 16, wherein the at least one conductive pillar extends through a dielectric material.

* * * * *